United States Patent
You et al.

(10) Patent No.: US 10,157,988 B1
(45) Date of Patent: Dec. 18, 2018

(54) FIN FIELD EFFECT TRANSISTOR (FINFET) DEVICE STRUCTURE WITH DUAL SPACERS AND METHOD FOR FORMING THE SAME

(71) Applicant: Taiwan Semiconductor Manufacturing Co., Ltd., Hsinchu (TW)

(72) Inventors: Jia-Chuan You, Taoyuan (TW); Chia-Hao Chang, Hsinchu (TW); Wai-Yi Lien, Hsinchu (TW); Yu-Ming Lin, Hsinchu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/652,607

(22) Filed: Jul. 18, 2017

(51) Int. Cl.
| | |
|---|---|
| *H01L 29/417* | (2006.01) |
| *H01L 29/66* | (2006.01) |
| *H01L 29/78* | (2006.01) |
| *H01L 21/768* | (2006.01) |
| *H01L 23/535* | (2006.01) |
| *H01L 29/06* | (2006.01) |

(52) U.S. Cl.
CPC .. *H01L 29/41791* (2013.01); *H01L 21/76829* (2013.01); *H01L 23/535* (2013.01); *H01L 29/0649* (2013.01); *H01L 29/6656* (2013.01); *H01L 29/66545* (2013.01); *H01L 29/66795* (2013.01); *H01L 29/785* (2013.01)

(58) Field of Classification Search
CPC ........... H01L 29/41791; H01L 29/0649; H01L 29/66545; H01L 29/6656; H01L 29/66795; H01L 29/785; H01L 21/76829; H01L 23/535
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 * | 8/2014 | Wann | ................... G06F 17/5068 257/401 |
| 8,823,065 B2 | 9/2014 | Wang et al. | |

(Continued)

*Primary Examiner* — Cheung Lee
*Assistant Examiner* — Stephen C Smith
(74) *Attorney, Agent, or Firm* — McClure, Qualey & Rodack, LLP

(57) ABSTRACT

A FinFET device structure is provided. The FinFET device structure includes a fin structure formed over a substrate and a first gate structure formed over the fin structure. The FinFET device structure includes a conductive plug formed over the first gate structure, and the conductive plug is electrically connected to the first gate structure. The FinFET device structure includes a first spacer layer formed on a sidewall surface of the conductive plug and a source/drain (S/D) contact structure formed over the fin structure and adjacent to the first gate structure. The FinFET device structure further includes a first insulation layer formed over the S/D contact structure and a second spacer layer formed on a sidewall surface of the first insulation layer. The conductive plug extends from a first position which is above the first spacer layers to a second position which is above the second spacer layer.

20 Claims, 28 Drawing Sheets

(56) References Cited

U.S. PATENT DOCUMENTS

| | | | |
|---|---|---|---|
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 * | 1/2016 | Liaw | H01L 21/76895 |
| 9,331,171 B2 * | 5/2016 | Hung | H01L 29/665 |
| 9,520,482 B1 | 12/2016 | Chang et al. | |
| 9,576,814 B2 | 2/2017 | Wu et al. | |
| 9,847,398 B1 * | 12/2017 | Hung | H01L 29/42364 |
| 2012/0273899 A1 * | 11/2012 | Wann | G06F 17/5068 257/401 |
| 2013/0181264 A1 * | 7/2013 | Liao | H01L 29/41791 257/288 |
| 2014/0151812 A1 * | 6/2014 | Liaw | H01L 21/76895 257/368 |
| 2015/0357431 A1 * | 12/2015 | Hung | H01L 29/66515 438/283 |
| 2018/0068951 A1 * | 3/2018 | Hung | H01L 23/535 |

* cited by examiner

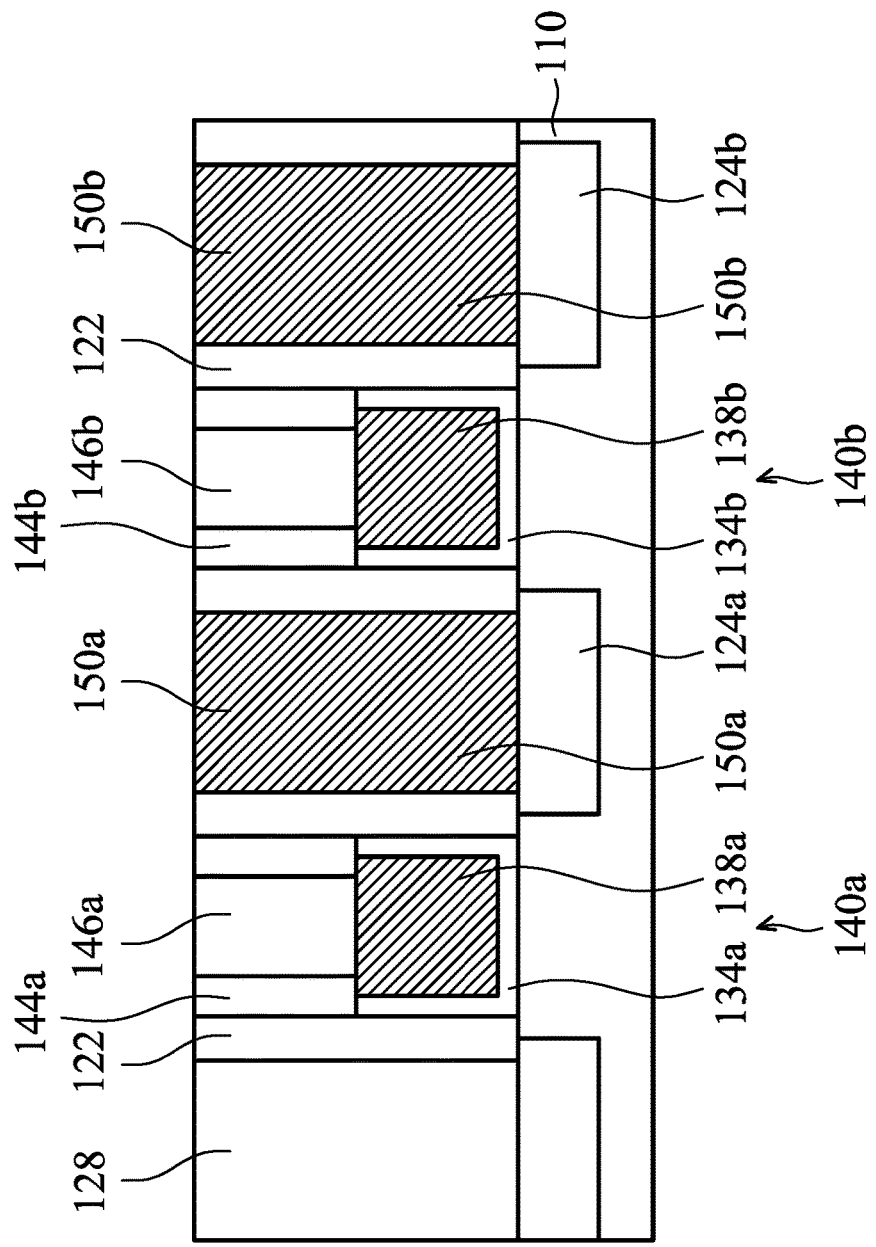

FIN FIELD EFFECT TRANSISTOR (FINFET) DEVICE STRUCTURE WITH DUAL SPACERS AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2K show cross-sectional representations of various stages of forming a FinFET device structure shown in FIG. 1G-1Q, in accordance with some embodiments of the disclosure.

DETAILED DESCRIPTION

Figure 1A:
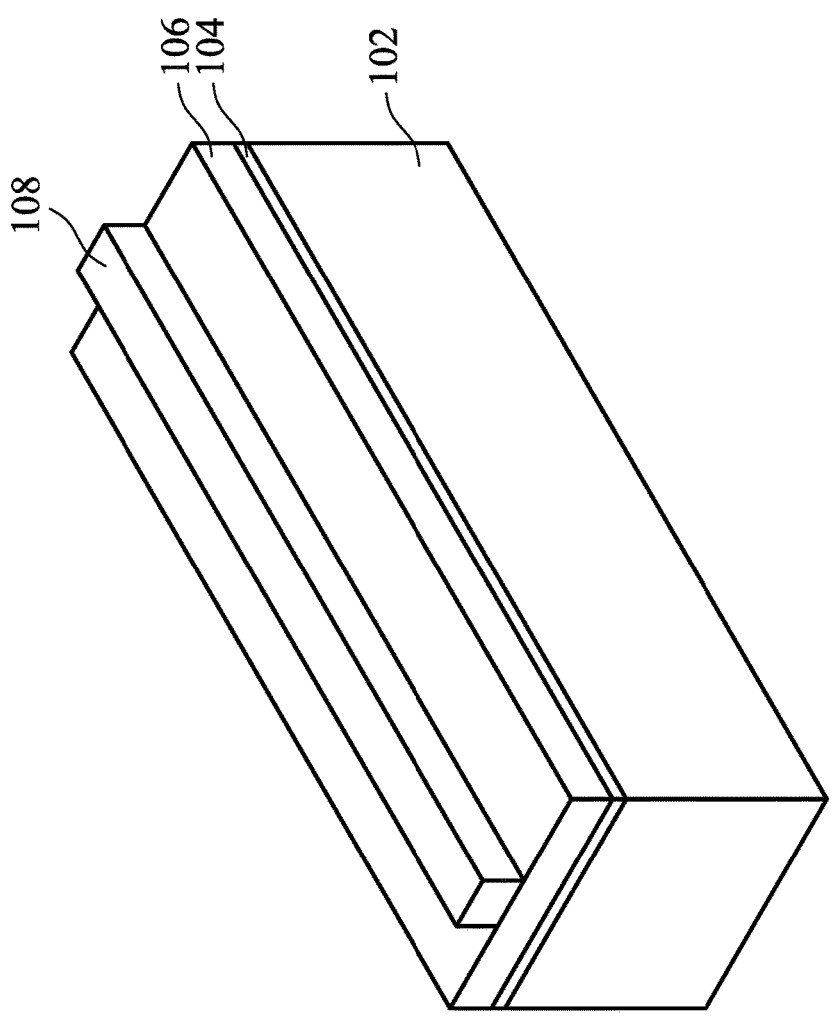
FIGS. 1A-1Q show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1Q show perspective representations of various stages of forming a FinFET device structure 100, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
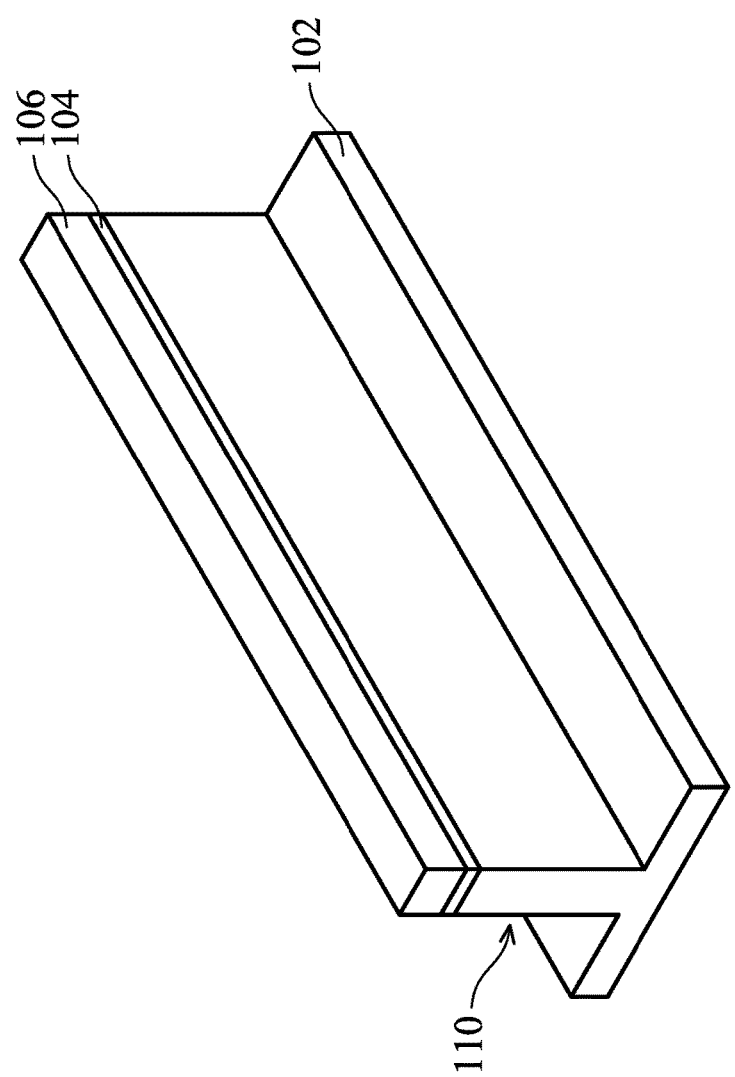

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
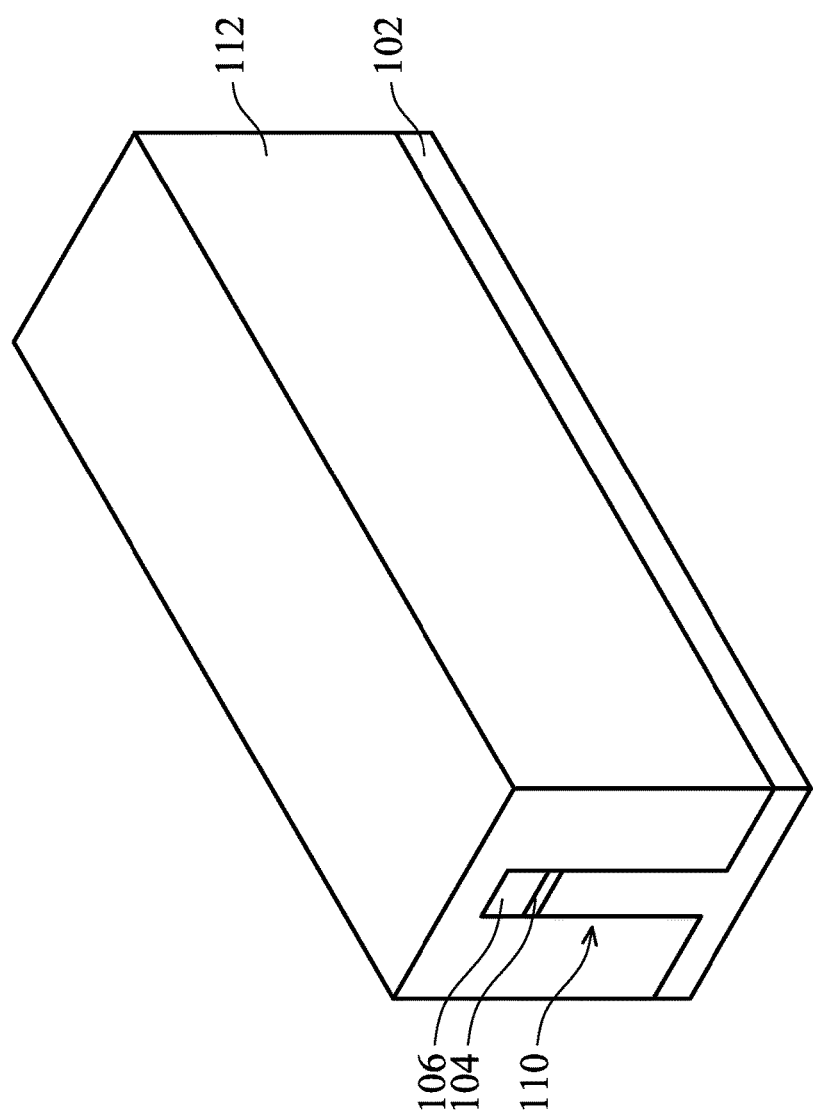

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process. Afterwards, the patterned dielectric layer 104 and the patterned mask layer 106 are removed.

Figure 1D:
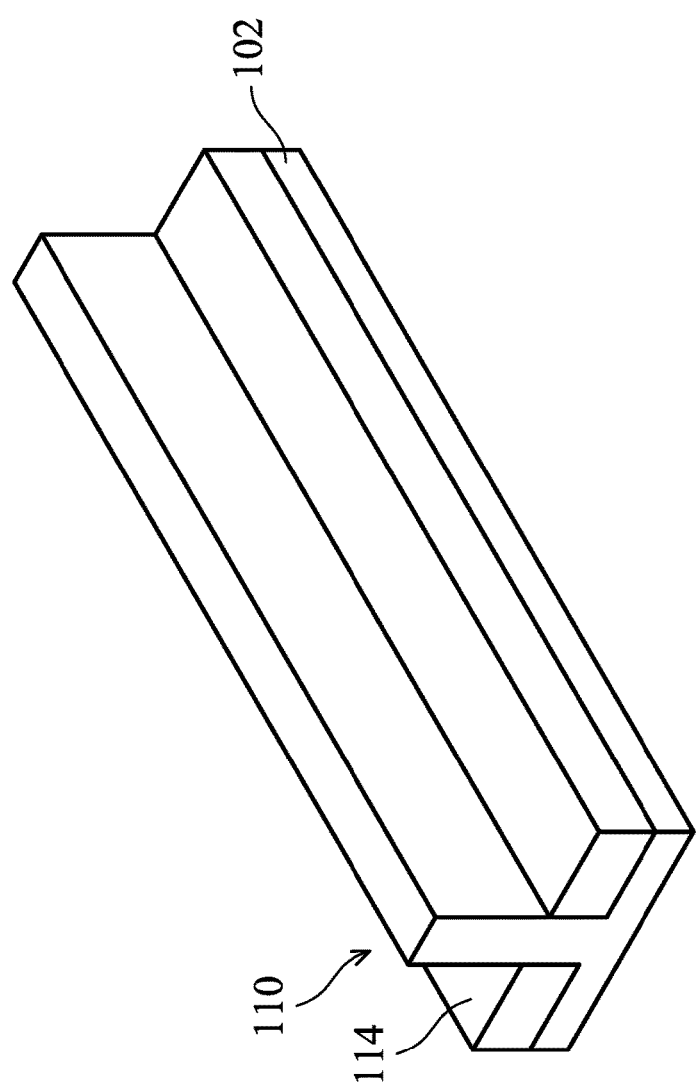

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

Figure 1E:
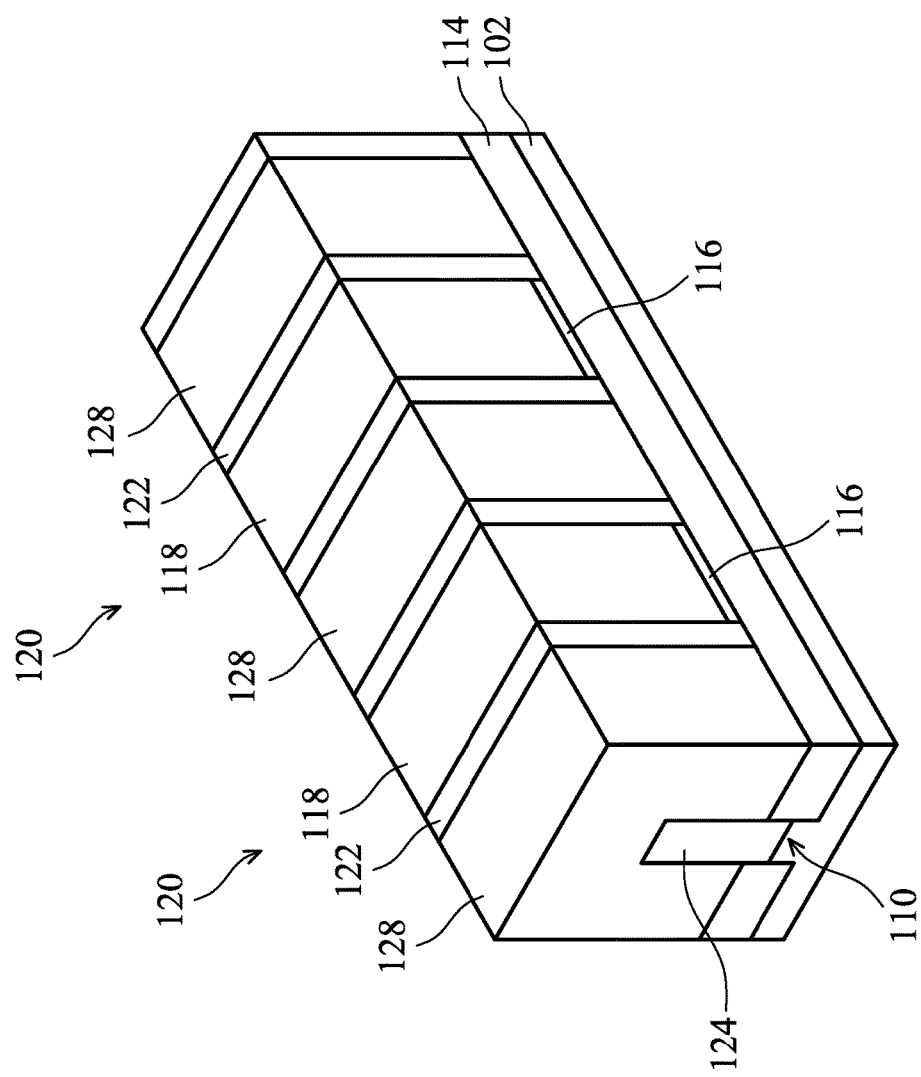

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100, the gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

The materials with a smaller dielectric constant (k value) can increase the speed of the device, but the materials with a smaller dielectric constant (k value) often have a lower etching resistance. In order to improve the etching resistance, an additional spacer layer (shown in FIG. 1I) adjacent to the gate spacer layers 122 is formed. The details for forming the spacer layer will be described in following steps.

Afterwards, source/drain (S/D) structures 124 are formed over the fin structure 110. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) (not shown) is formed over the substrate 102, and an inter-layer dielectric (ILD) structure 128 is formed over the contact etch stop layer 126. In some other embodiments, the CESL is made of silicon nitride, silicon oxynitride, and/or other applicable materials. The contact etch stop layer may be formed by plasma enhanced CVD, low-pressure CVD, ALD, or other applicable processes.

The ILD structure 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 128 may be formed by chemical vapor deposition (CVD), physical vapor deposition, (PVD), atomic layer deposition (ALD), spin-on coating, or another applicable process.

Afterwards, a polishing process is performed on the ILD structure 128 until the top surface of the dummy gate structure 120 is exposed. In some embodiments, the ILD structure 128 is planarized by a chemical mechanical polishing (CMP) process.

Figure 1F:
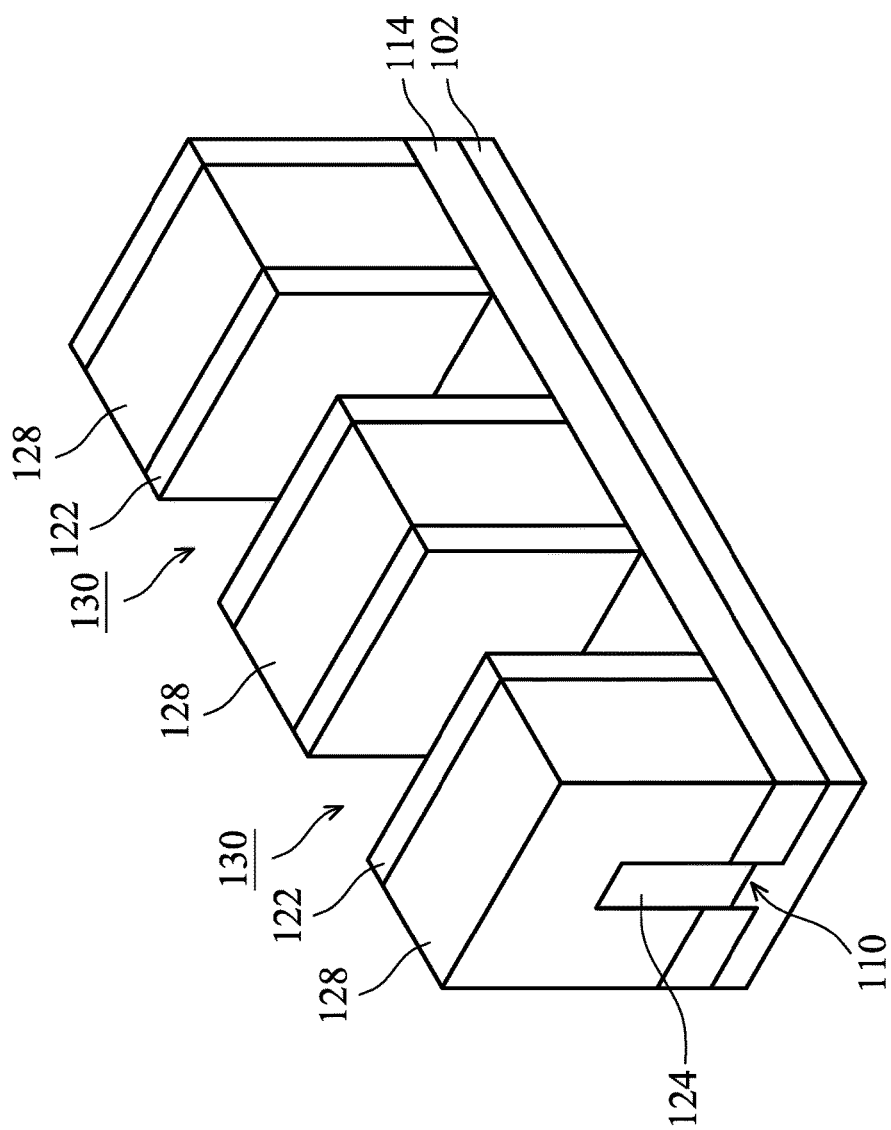

Afterwards, as shown in FIG. 1F, the dummy gate structure 120 is removed to form trenches 130 in the ILD structure 128, in accordance with some embodiments. The dummy gate dielectric layer 116 and the dummy gate electrode layer 118 are removed by an etching process, such as a dry etching process or a wet etching process.

Figure 1G:
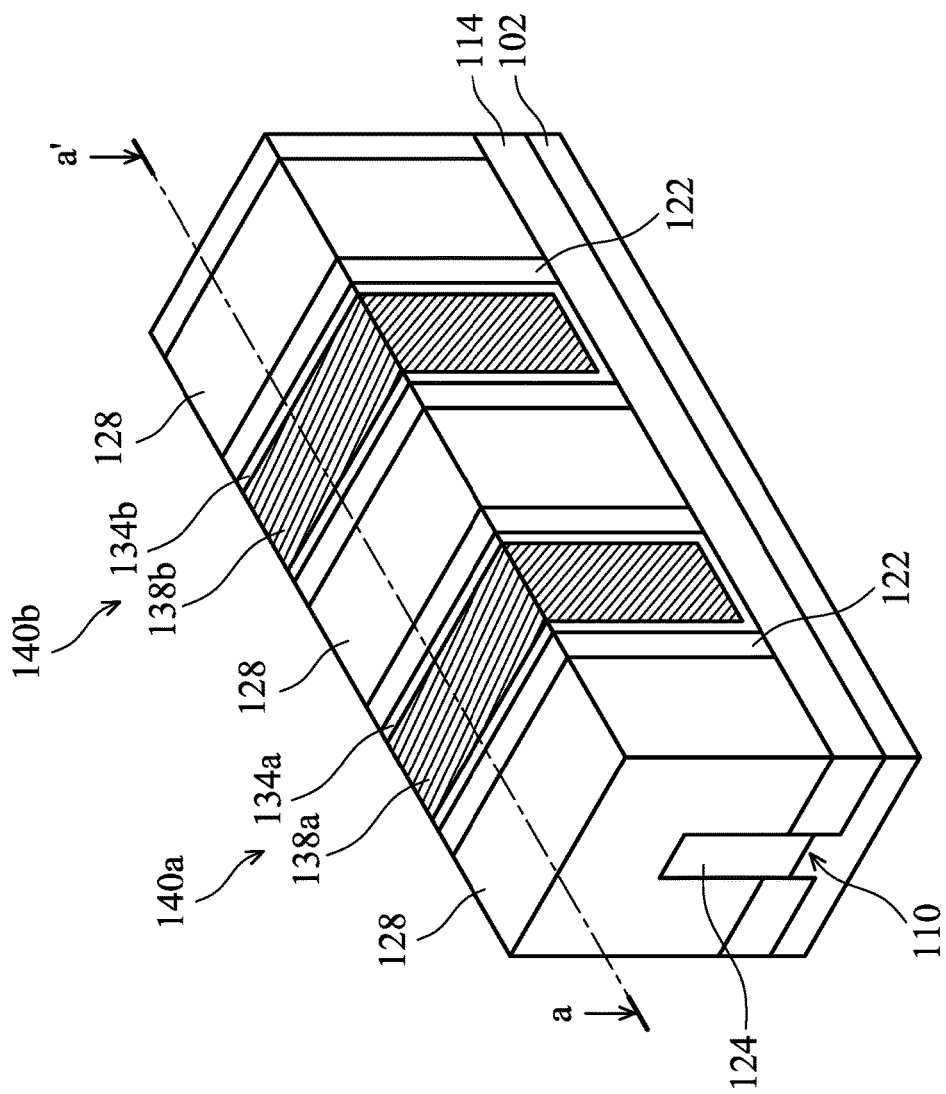

Next, as shown in FIG. 1G, a first gate structure 140a and a second gate structure 140b are formed in each of the trench 130, in accordance with some embodiments. The first gate structure 140a includes a first gate dielectric layer 134a and a first gate electrode layer 138a. The second gate structure 140b includes a second gate dielectric layer 134b and a second gate electrode layer 138b.

In some other embodiments, the first gate structure 140a further includes a first work function layer between the first gate dielectric layer 134a and the first gate electrode layer 138a. The second gate structure 140b further includes a second work function layer between the second gate dielectric layer 134b and the second gate electrode layer 138b.

The first gate dielectric layer 134a and a second gate dielectric layer 134b may be a single layer or multiple layers. The first gate dielectric layer 134a and the second gate dielectric layer 134b are independently made of silicon oxide (SiOx), silicon nitride (SixNy), silicon oxynitride (SiON), dielectric material(s) with high dielectric constant (high-k), or a combination thereof. In some embodiments, the first gate dielectric layer 134a and the second gate dielectric layer 134b are deposited by a plasma enhanced chemical vapor deposition (PECVD) process or by a spin coating process.

The first gate electrode layer 138a and the second gate electrode layer 138b are independently made of conductive material, such as aluminum (Al), copper (Cu), tungsten (W), titanium (Ti), tantalum (Ta), or other applicable materials. The first gate electrode layer 138a and the second gate electrode layer 138b are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

The work function layer (not shown) is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

Figure 1H:
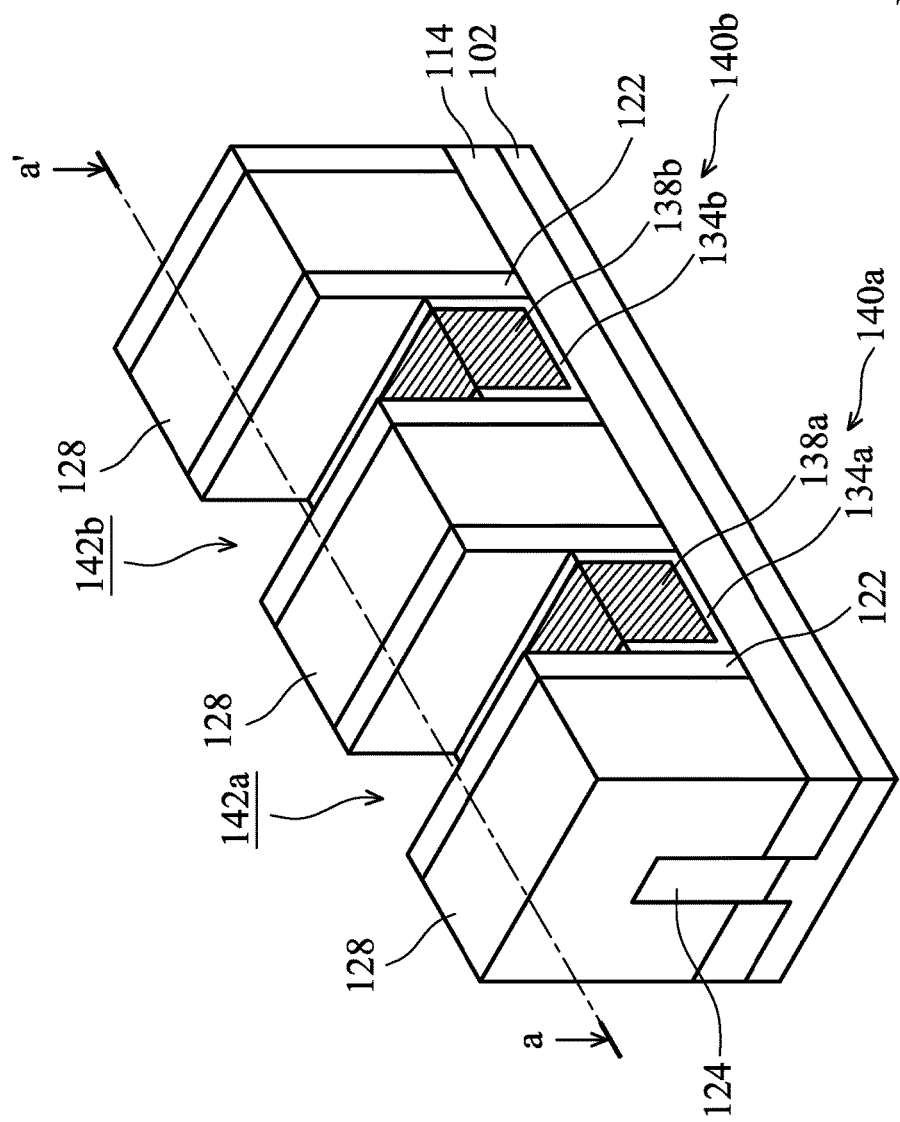

Afterwards, as shown in FIG. 1H, a top portion of the first gate structure 140a and a top portion of the second gate structure 140b are removed, in accordance with some embodiments. The top portion of the first gate dielectric layer 134a, the top portion of the first gate electrode layer 138a, the top portion of the second gate dielectric layer 134b, the top portion of the second gate electrode layer 138b are removed by an etching process, such as a dry etching process or a wet etching process. As a result, a first opening 142a above the remaining first gate structure 140a and a second opening 142b above the second gate structure 140b are obtained.

Figure 1I:
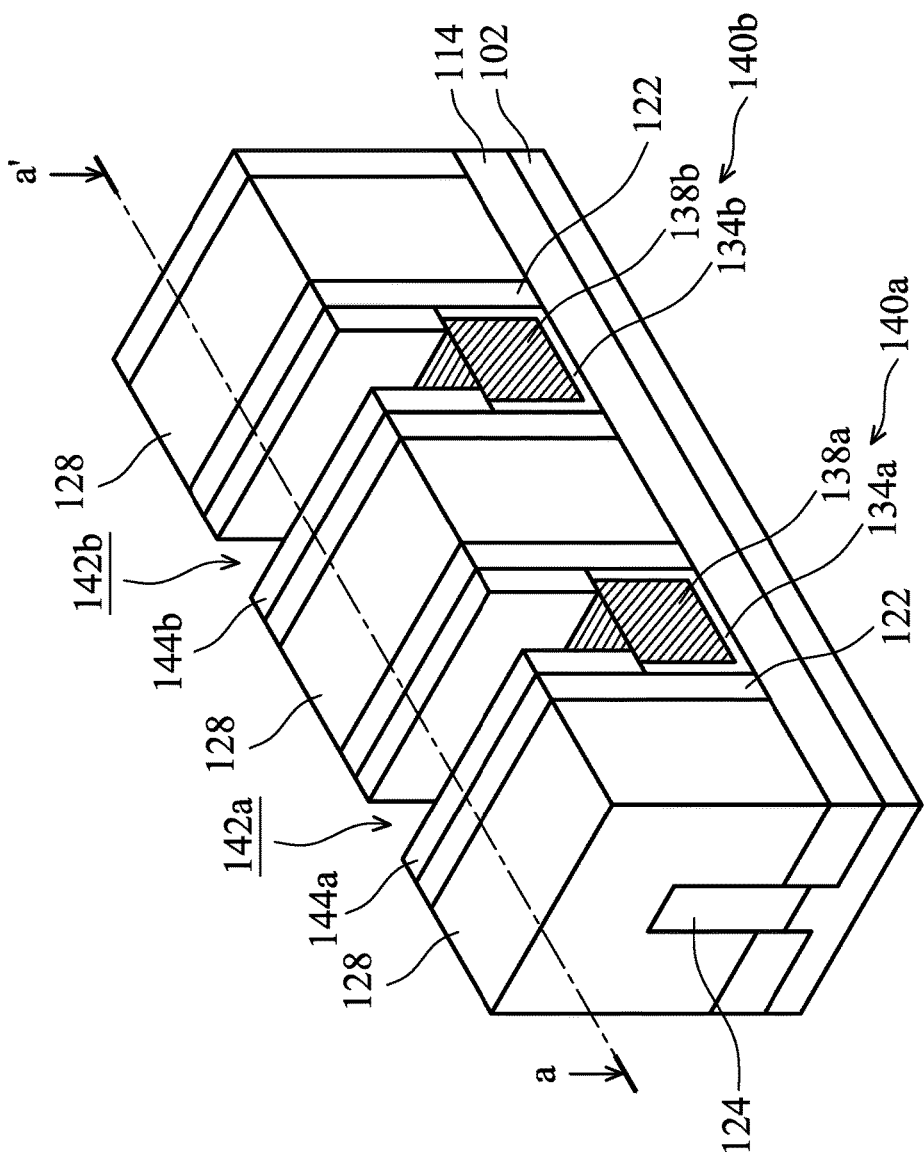

Next, as shown in FIG. 1I, a first spacer layer 144a and a second spacer layer 144b are formed above the first gate structure 140a and the second gate structure 140b, respectively, in accordance with some embodiments. More specifically, a pair of first spacer layers 144a are formed on opposite sidewall surfaces of the first opening 142a, and a pair of second spacer layers 144b are formed on opposite sidewall surfaces of the second opening 142b. The first spacer layer 144a and the second spacer layer 144b are used as etching stop layers to protect the underlying layers form being etched or damaged.

A spacer material is formed on the bottom surface and sidewall surfaces of the first opening 142a, that of the second opening 142b, the gate spacer layer 122 and the ILD structure 128, and then a portion of the spacer material is removed to form the pair of first spacer layers 114a and the pair of second spacer layers 144b.

In some embodiments, the first spacer layer 144a and the second spacer layer 144b are independently made of a high-k dielectric material, such as k value in a range from about 5 to about 100. In some embodiments, the dielectric constant (k value) of the first spacer layer 144a is greater than the dielectric constant (k value) of the gate spacer layers 122. In other words, the dielectric constant (k value) of the gate spacer layers 122 is smaller than the dielectric constant (k value) of the first spacer layer 144a. In some embodiments, the density of the first spacer layer 144a is greater than the density of the gate spacer layers 122. Similarly, the k value of the second spacer layer 144b is greater than the k value of the gate spacer layers 122, and the density of the second spacer layer 144b is greater than the density of the gate spacer layers 122.

In some embodiments, the first spacer layer 144a and the second spacer layer 144b are independently made of SiC, SiCN, SION, AlO, AlON, ZrO, ZrM, HfO, or anther applicable materials. In some embodiments, the first spacer layer 144a and the second spacer layer 144b are deposited by a deposition process, such as chemical vapor deposition (CVD), physical vapor deposition (PVD), or spin coating process.

Figure 1J:
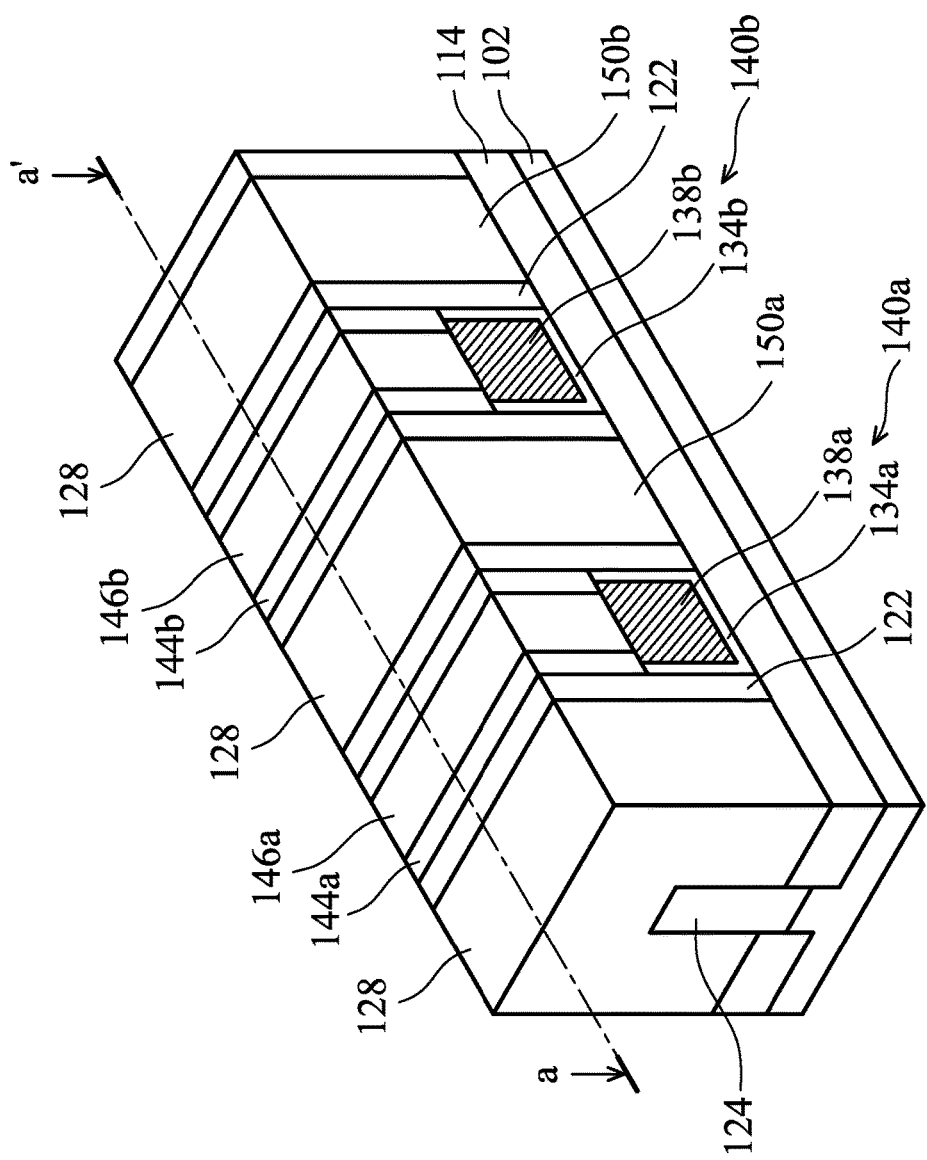

Afterwards, as shown in FIG. 1J, a first insulation layer 146a is formed over the first gate structure 140a and a second insulation layer 146b is formed over the second gate structure 140b, in accordance with some embodiments. The first insulation layer 146a is between two first spacer layers 144a, and the second insulation layer 146b is between two second spacer layers 144b.

The first insulation layer 146a and the second insulation layer 146b are made of the same material and are formed simultaneously. In some embodiments, the first insulation layer 146a is made of SixOy, SiN, SOC or another applicable material. In some embodiments, the first insulation layer 146a and the second insulation layer 146b are deposited by a deposition process, such as chemical vapor deposition (CVD), physical vapor deposition (PVD), or spin coating process.

Figure 1K:
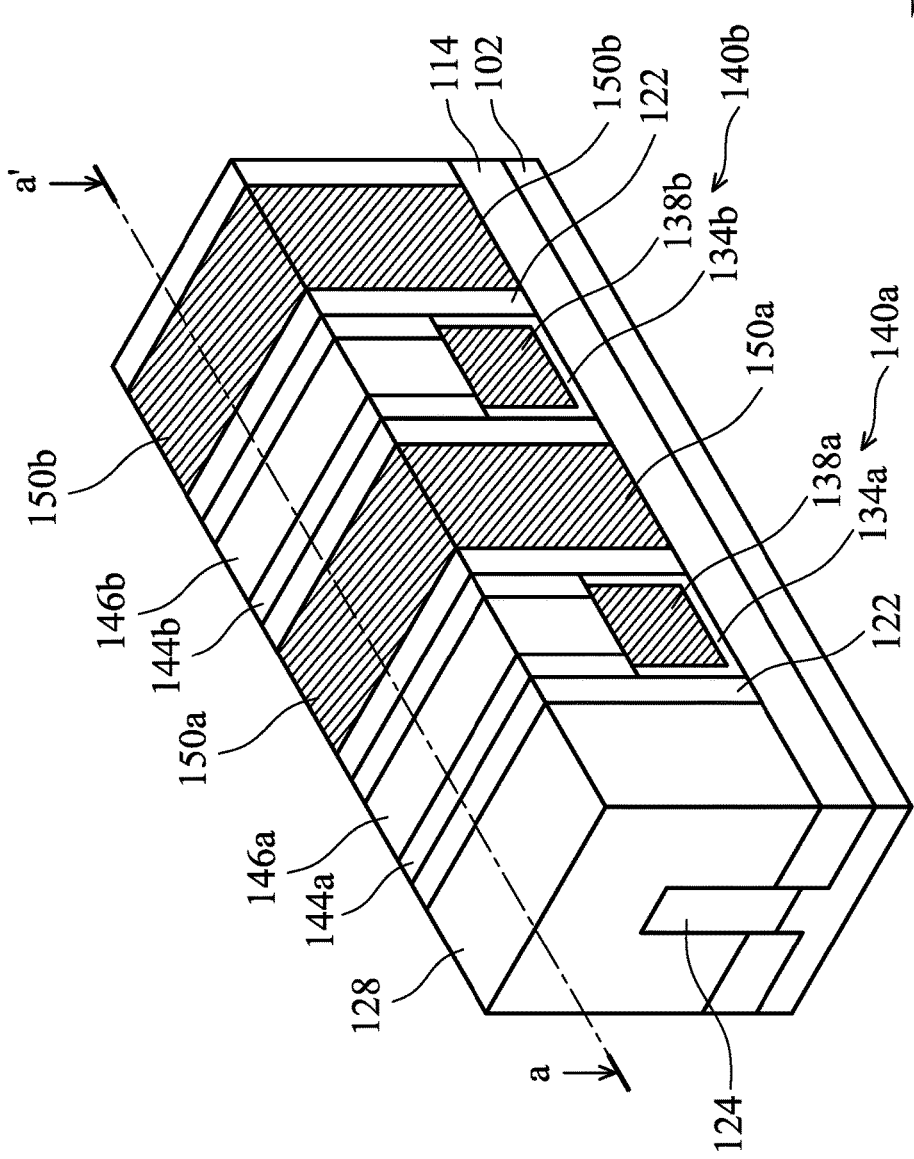

Next, as shown in FIG. 1K, a portion of the ILD structure 128 is removed to form a recess (not shown) and a metal layer is filled into the recess, in accordance with some embodiments. Afterwards, the excess metal layer is removed to form a first S/D contact structure 150a and a second S/D structure over the fin structure 110 and the S/D structures 124.

Figure 1L:
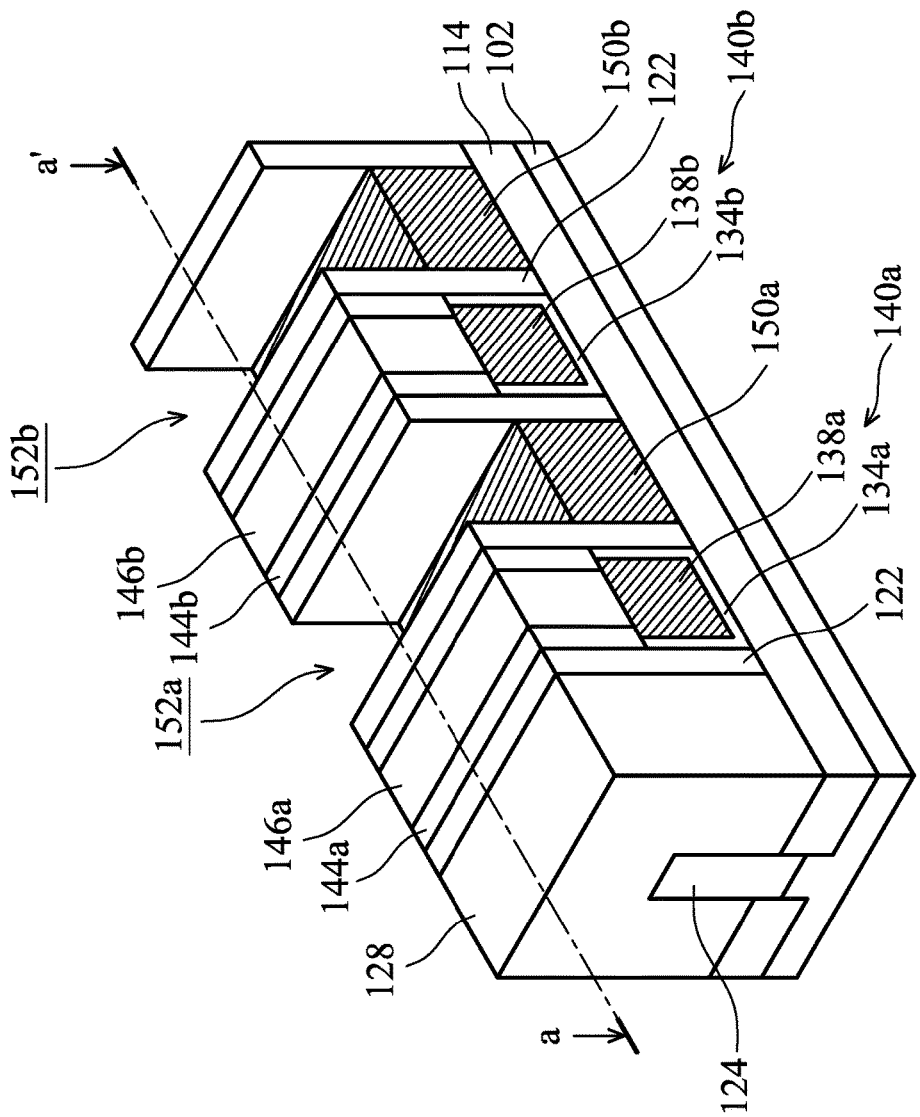

Afterwards, as shown in FIG. 1L, a top portion of the first S/D contact structure 150a and a top portion of the second S/D contact structure 150b are removed to form a third opening 152a and a fourth opening 152b, respectively, in accordance with some embodiments. As a result, the first S/D contact structure 150a is between the first gate structure 140a and the second gate structure 140b, and the second gate structure 140b is between the first S/D contact structure 150a and the second S/D contact structure 150b.

Figure 1M:
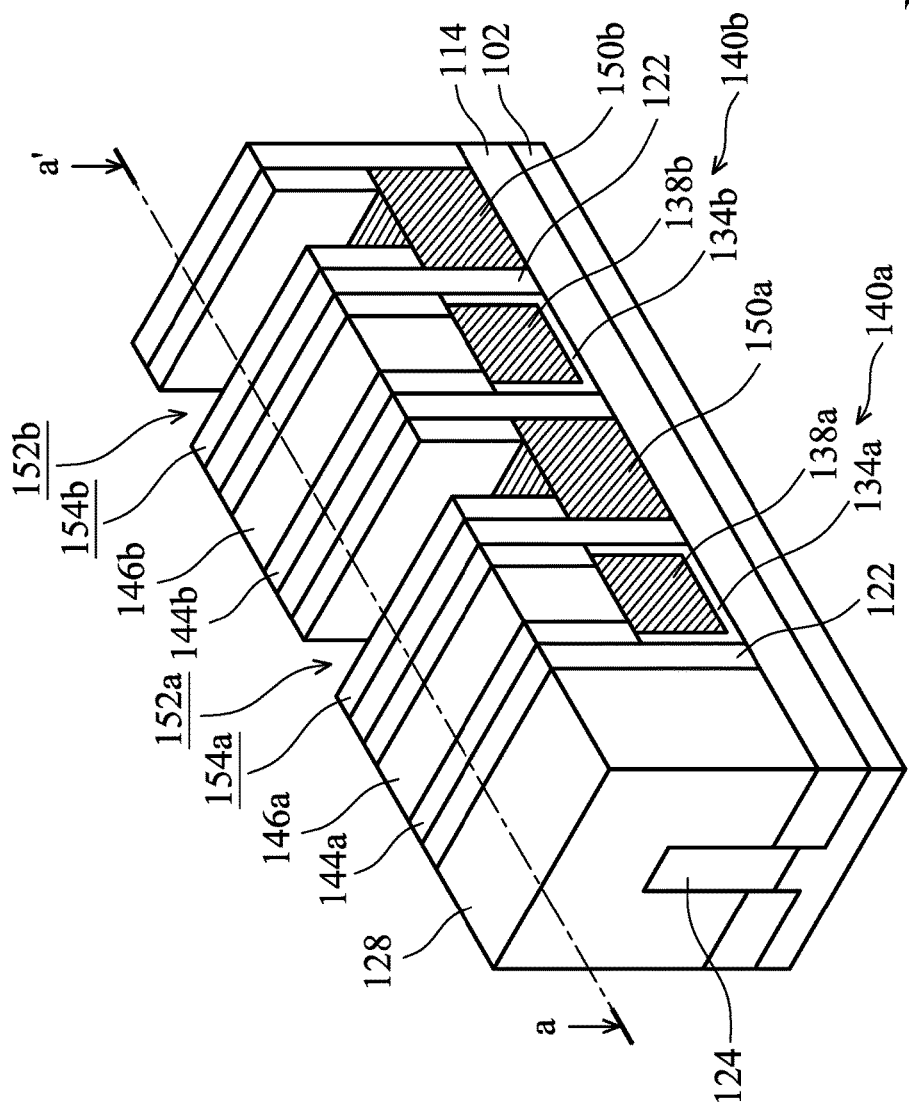

As shown in FIG. 1M, a third spacer layer 154a is formed over the first S/D contact structure 150a, and a fourth spacer layer 154b is formed over the second S/D contact structure 150b, in accordance with some embodiments. The third spacer layer 154a is formed in a portion of the third opening 152a and the fourth spacer layer 154b is formed in a portion of the fourth opening 152b.

More specifically, a pair of third spacer layers 154a are formed on opposite sidewall surfaces of the third opening 152a, and a pair of fourth spacer layers 154b are formed on opposite sidewall surfaces of the fourth opening 152b. The third spacer layer 154a and the fourth spacer layer 154b are used as etching stop layers to protect the underlying layers form being etched or damaged.

In some embodiments, the first spacer layer 144a, the second spacer layer 144b, the third spacer layer 154a and the fourth spacer layer 154b are made of the same material.

Figure 1N:
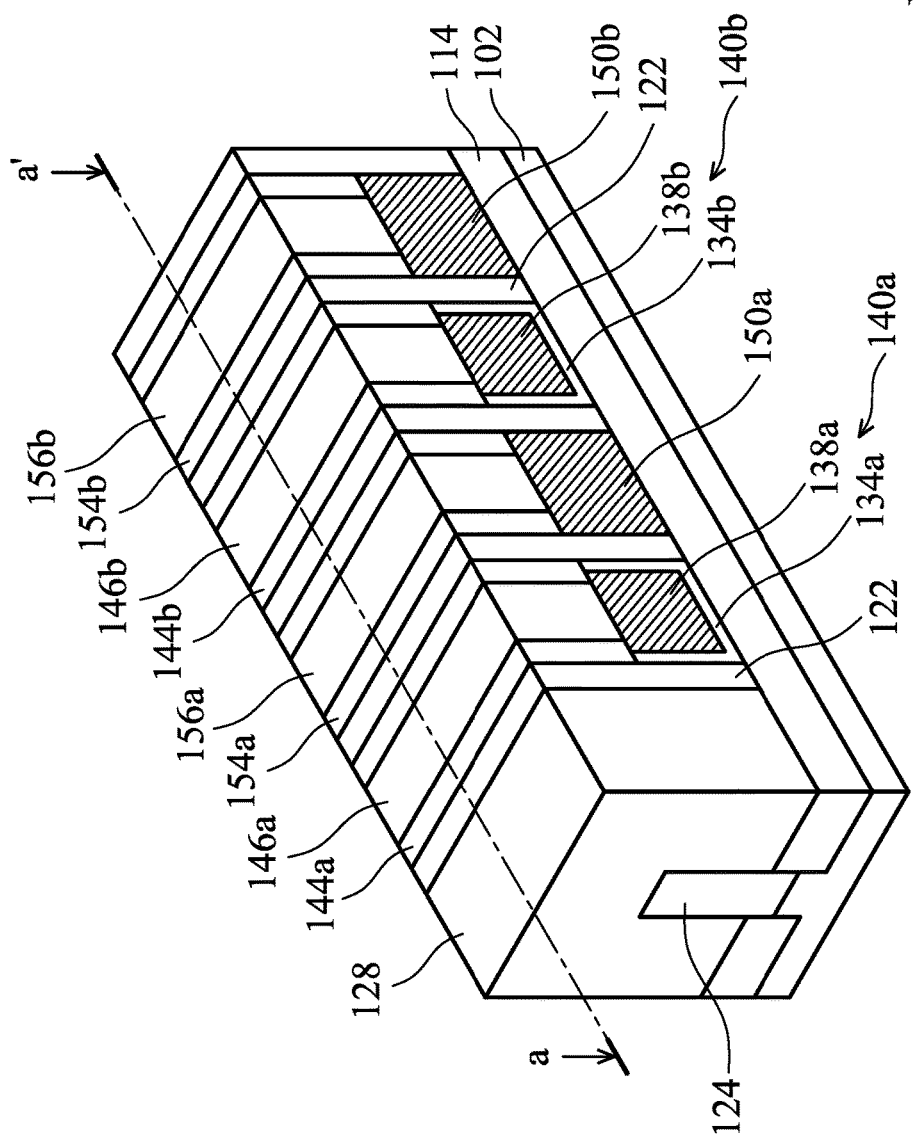

As shown in FIG. 1N, a third insulation layer 156a is formed over the first S/D contact structure 150a, and the fourth insulation layer 156b is formed over the second S/D contact structure 150b, in accordance with some embodiments. The third insulation layer 156a is between two third spacer layers 154a, and the fourth insulation layer 156b is between two fourth spacer layers 154b. The third insulation layer 156a and the fourth insulation layer 156b are made of the same material and are formed simultaneously.

Figure 1O:
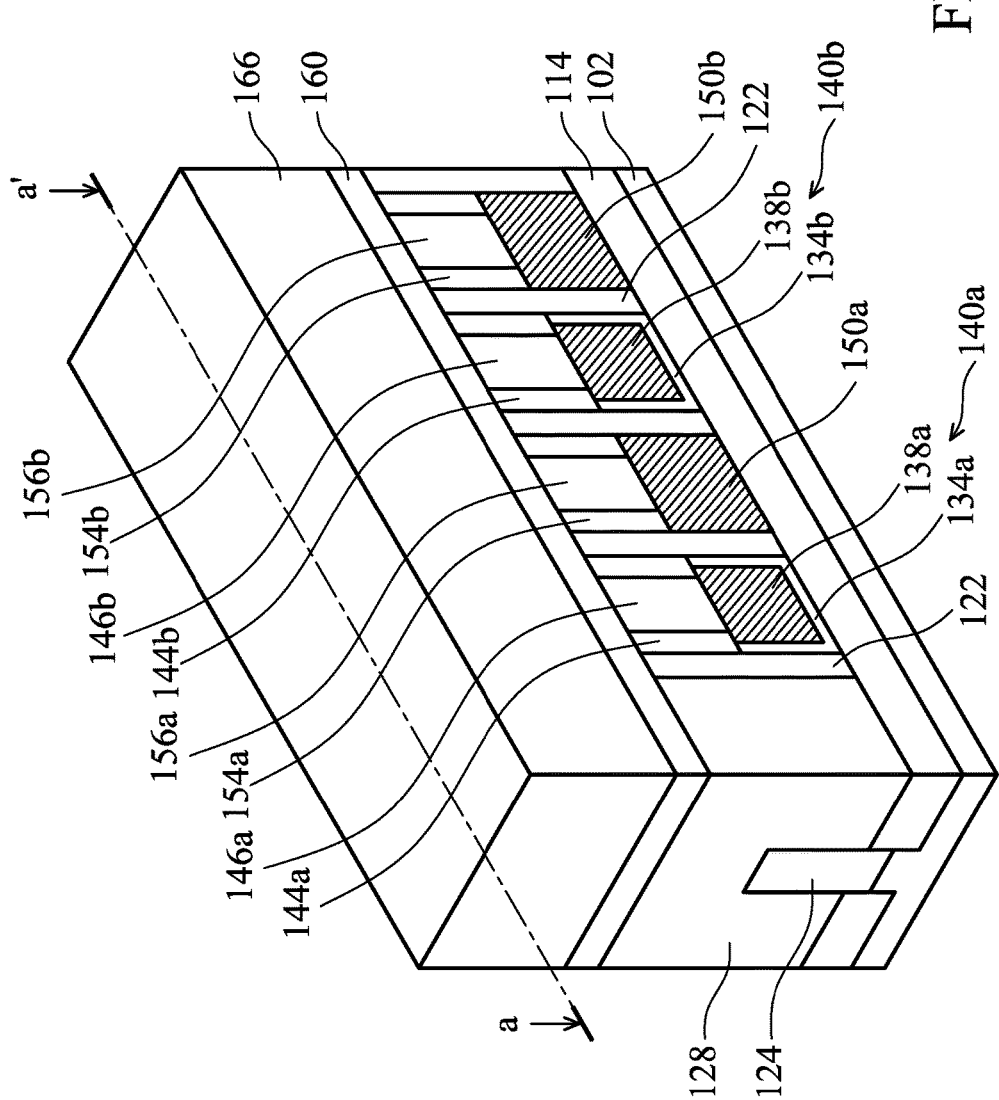

Afterwards, as shown in FIG. 1O, an etch stop layer 160 is formed over the first spacer layer 114a, the second spacer layer 144b, the third spacer layer 154a, the fourth spacer layer 164b, the first insulation layer 146a, the second insulation layer 146b, the third insulation layer 156a and the fourth insulation layer 156b, in accordance with some embodiments. Next, a dielectric layer 166 is formed over the etch stop layer 160.

In some embodiments, the etch stop layer 160 is made of silicon nitride, silicon oxynitride, and/or other applicable materials. The etch stop layer 160 may be formed by plasma enhanced CVD, low-pressure CVD, ALD, or other applicable processes. The dielectric layer 166 is made of silicon oxide (SiOx), silicon nitride (SixNy), silicon oxynitride (SiON), dielectric material(s) with low dielectric constant (low-k), or combinations thereof. The dielectric layer 166 is formed by a deposition process, such as a chemical vapor deposition (CVD) process, a high-density plasma chemical vapor deposition (HDPCVD) process, a spin-on process, a sputtering process, or another applicable process.

Figure 1P:
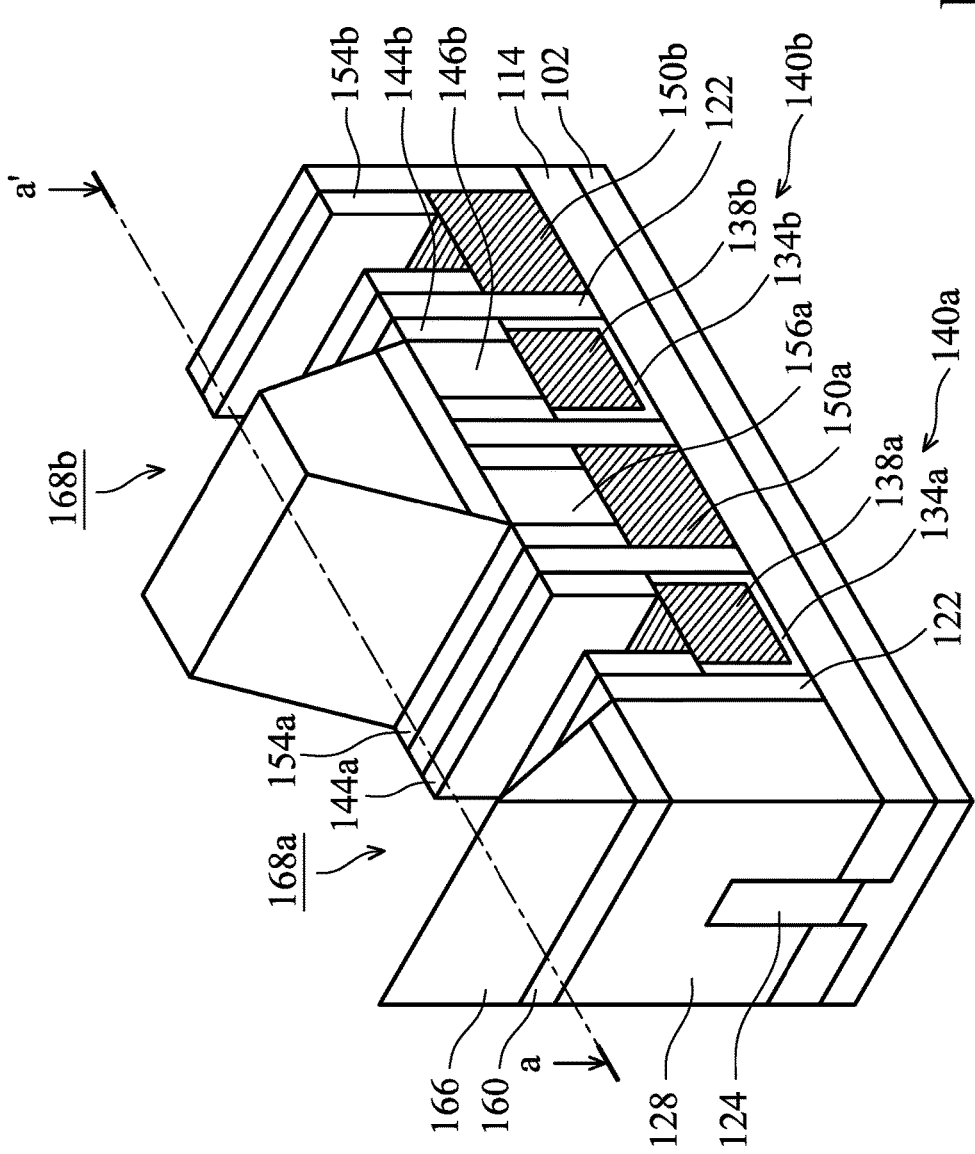
Figure 1Q:
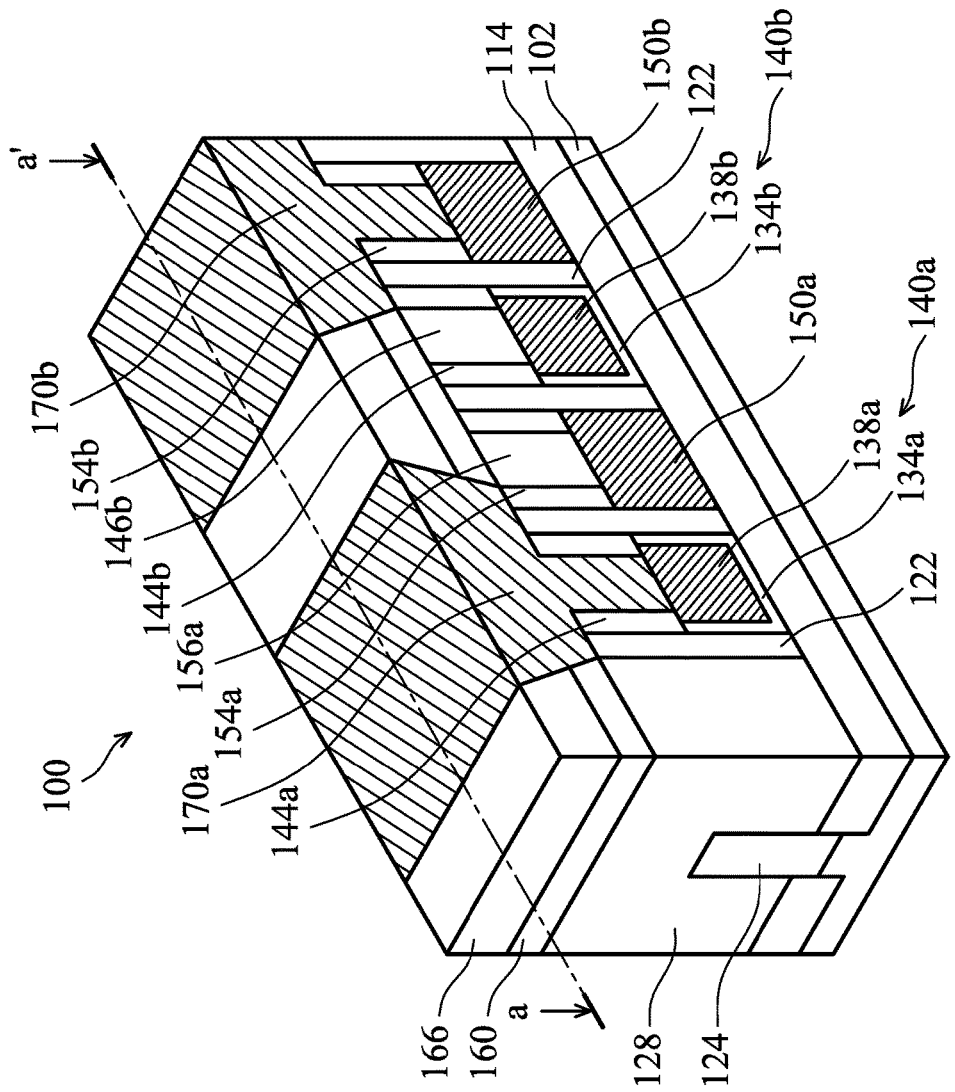

Next, as shown in FIG. 1P, a portion of the dielectric layer 166 and a portion of etch stop layer 160 are removed, and then a portion of the first insulation layer 146a is removed and a portion of the fourth insulation layer 156b are removed, in accordance with some embodiments. As a result, a first trench 168a over the first gate structure 140a and a second trench 168b over the second S/D contact structure 150b are obtained. The removal process may be a multiple etching processes.

When the first insulation layer 146a is removed, the first spacer layer 144a and the third spacer layer 154a are not removed since the first spacer layer 144a and the third spacer layer 154a both are made of a higher etching resistant material with respect to the first insulation layer 146a.

The term of "selectivity" or "etching selectivity" is defined as the ratio of etching rate of one material (the reference material) relative to another material (the material of interest). An increase in etch selectivity means that the selected material, or material of interest, is harder to etch. A decrease in etch selectivity means that the selected material is easier to etch. The etching selectivity of the first spacer layer 144a with respect to the first insulation layer 146a is high, and therefore the first insulation layer 146a is removed by the etching process while the first spacer layer 144a is not removed. In some embodiments, the etching selectivity of the first spacer layer 144a to the first insulation layer 146a is in a range from about 10 to about 20. Similarly, the etching selectivity of the first spacer layer 144a with respect to the etch stop layer 160 and the dielectric layer 166 is high. The high etching selectivity means that the first spacer layer 144a is not easy to damage or etch in the etching process.

Since the third spacer layer 154a is also made of high etching resistant material, the third spacer layer 154a is not removed when the first insulation layer 146a is removed. The third spacer layer 154a provides a protection for the underlying layers, such as the first S/D contact structure 150a, and therefore the first S/D contact structure 150a is not exposed or damaged by the etching process.

It should be noted that the third insulation layer 156a is not removed due to the protection of the third spacer layer 154a. If no third spacer layer is adjacent to the third insulation layer 156a, the third insulation layer 156a is easy to damage or etch in the etching process. In order to prevent the third insulation layer 156a from being etched, the material of the third insulation layer 156a may be different from that of the first insulation layer 146a. However, even if the third insulation layer 156a and the first insulation layer 146a are made of different materials, the third insulation layer 156a still may be removed. In addition, the risk of an electrical short forming between the first conductive plug 170a (shown in FIG. 1Q) and the first S/D contact structure 150a may be increased once the third insulation layer 156a is etched.

In contrast to the embodiments without spacer layers, the third spacer layer 154a of this invention is formed to protect the third insulation layer 156a and the first S/D contact structure 150a. Due to the protection of the third spacer layers 154a, the third insulation layer 156a and the first insulation layer 146a may be made of the same material. Therefore, fabrication time and cost are reduced. Furthermore, the first spacer layer 144a is adjacent to the first insulation layer 146a, the first spacer layer 144a is not removed while the first insulation layer 146a is removed. The first spacer layer 144a, the gate spacer layer 122 and the third spacer layer 154a provide multiple protections to resist the etching process.

The etching selectivity of the fourth spacer layer 154b with respect to the fourth insulation layer 156b is high, and therefore the fourth insulation layer 156b is removed by the etching process while the fourth spacer layer 154b is not removed. In some embodiments, the etching selectivity of the fourth spacer layer 154b to the fourth insulation layer 156b is in a range from about 10 to about 20. In addition, the etching selectivity of the fourth spacer layer 154b with respect to the etch stop layer 160 and the dielectric layer 166 is high.

Afterwards, as shown in FIG. 1Q, a first conductive plug 170a is formed in the first trench 168a, and a second conductive plug 170b is formed in the second trench 168b, in accordance with some embodiments. The first conductive plug 170a passes through the etch stop layer 160 and the dielectric layer 166, and the second conductive plug 170b passes through the etch stop layer 160 and the dielectric layer 166. A portion of the first conductive plug 170a and a portion of the second conductive plug 170b are embedded in the dielectric layer 166.

The first conductive plug 170a is electrically connected to the first gate structure 140a, and the second conductive plug 170b is electrically connected to the second S/D contact structure 150b. In some embodiments, the first conductive plug 170a has a T-shaped structure. In some embodiments, the second conductive plug 170b has a T-shaped structure.

In some other embodiments, a diffusion barrier layer (not shown) is formed below the first conductive plug 170a and the second conductive plug 170b. The diffusion barrier layer

420 may be made of Ta, TaN, Ti, TiN, or CoW. The first conductive plug 170a and the second conductive plug 170b are independently made of copper (Cu), copper alloy, aluminum (Al), aluminum alloys, or combinations thereof. Alternatively, other applicable materials may be used. In some embodiments, the first conductive plug 170a and the second conductive plug 170b are formed by plating.

The outer sidewall surface of the first conductive plug 170a is substantially aligned with the sidewall surface of the third spacer layer 154a which is over the first S/D contact structure 150a. The first conductive plug 170a is in direct contact with the third spacer layer 154a and is not in direct contact with the first S/D contact structure 150a. The first conductive plug 170a extends from a first position which is above the first spacer layer 144a to a second position which is above the third spacer layer 154a.

The outer sidewall surface of the second conductive plug 170b is substantially aligned with the sidewall surface of the second spacer layer 144b which is over the second gate structure 140b. The second conductive plug 170b is in direct contact with the second spacer layer 144b and is not in direct contact with the second gate structure 140b. The second conductive plug 170b extends from a first position which is above the fourth spacer layer 154b to a second position which is above the second spacer layer 144b.

Note that at the left side of structure of FIG. 1Q, the third insulation layer 156a is not removed due to the protection of the third spacer layer 154a when the first insulation layer 146a is removed. Furthermore, since the third insulation layer 156a is not removed, the first S/D contact structure 150a which is below the third insulation layer 156a is protected and not removed. Therefore, the risk of an electrical connection forming between the first conductive plug 170a and the first S/D contact structure 150a is reduced. The electrical shorting problem is prevented.

At the right side of structure of FIG. 1Q, the second insulation layer 146b is not removed due to the protection of the second spacer layer 144b when the fourth insulation layer 156b is removed. Furthermore, since the second insulation layer 146b is not removed, the second gate structure 140b which is below the fourth insulation layer 156b is protected and not removed. Therefore, the risk of an electrical connection forming between the second conductive plug 170b and the second gate structure 140b is reduced.

Since the first spacer layer 144a and the third spacer layer 154a provide good protection, the first conductive plug 170a will not be in direct contact with the first S/D contact structure 150a. Similarly, since the second spacer layer 144b and the fourth spacer layer 154b provide good protection, the second conductive plug 170b will not be in direct contact with the second gate structure 140b.

Furthermore, if no spacer layers 144a, 144b, 154a, 154b provide protection, in some other embodiments, the gate spacer layers 122 should be designed to have a higher etching resistance. The higher k materials are often more etch resistant, but the higher k materials may reduce the speed of the FinFET device structure. There is a trade-off between the k value and the etching resistance of the gate spacer layers 122. Since the spacer layers 144a, 144b, 154a, 154b can resist the etching process to protect the underlying layers, the gate spacer layers 122 may be made of low-k materials to increase the speed of the FinFET device structure 100. Therefore, the parasitic capacitance of the FinFET device structure 100 is reduced and the performance of the FinFET device structure 100 is improved.

With geometric size shrinking as technology nodes advance to 10 nm and beyond, the enlargement of isolation window become important. The spacer layers 144a, 144b, 154a, 154b of the invention are designed to have a higher etching resistance to protect the underlying layers, and therefore the isolation window is enlarged.

Figure 2A:
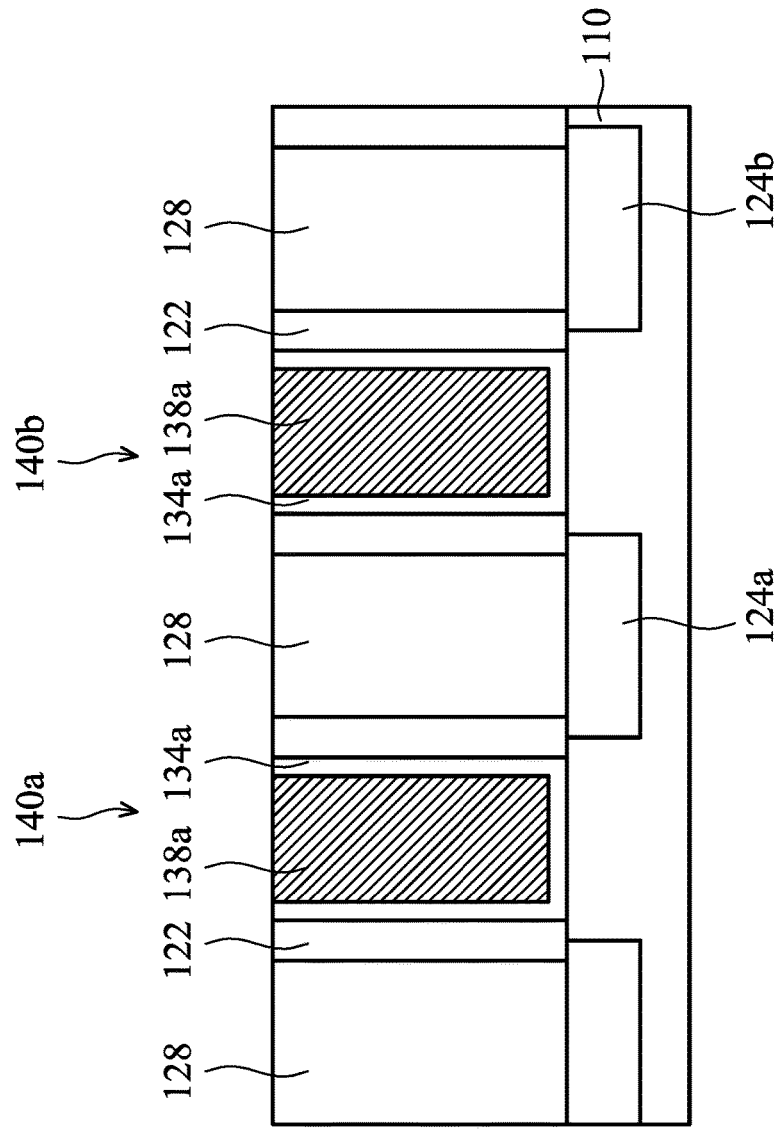

FIGS. 2A-2K show cross-sectional representations of various stages of forming a FinFET device structure 100 shown in FIG. 1G-1Q, in accordance with some embodiments of the disclosure. FIG. 2A is a cross-sectional representation taken along the AA' line of FIG. 1G.

As shown in FIG. 2A, the first gate structure 140a and the second gate structure 140b are formed in the each of the trench 130, in accordance with some embodiments. The first gate structure 140a includes the first gate dielectric layer 134a and the first gate electrode layer 138a. The second gate structure 140b includes the second gate dielectric layer 134b and the second gate electrode layer 138b. A first source/drain (S/D) structure 124a and a second S/D structure 124b are adjacent to the fin structure 110.

Figure 2B:
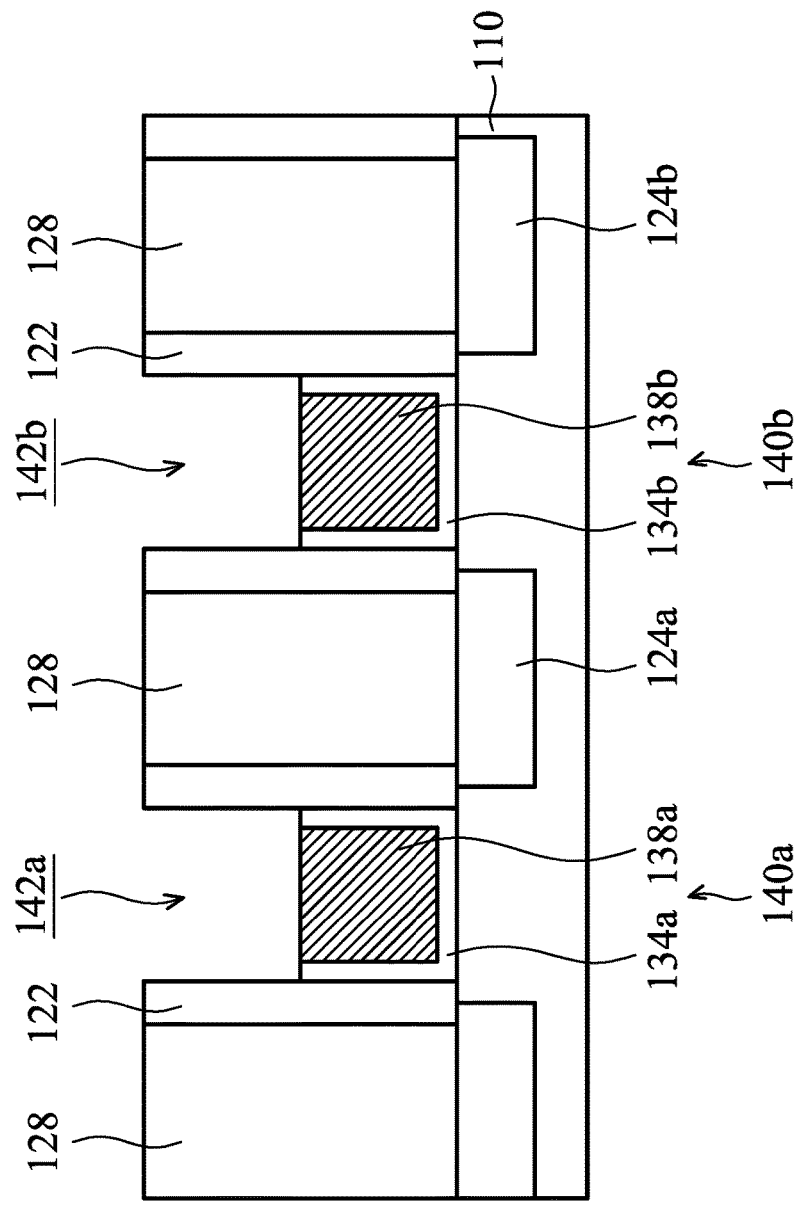

Afterwards, as shown in FIG. 2B, a top portion of the first gate structure 140a and a top portion of the second gate structure 140b are removed, in accordance with some embodiments. As a result, a first opening 142a above the remaining first gate structure 140a and a second opening 142b above the second gate structure 140b are obtained.

Figure 2C:
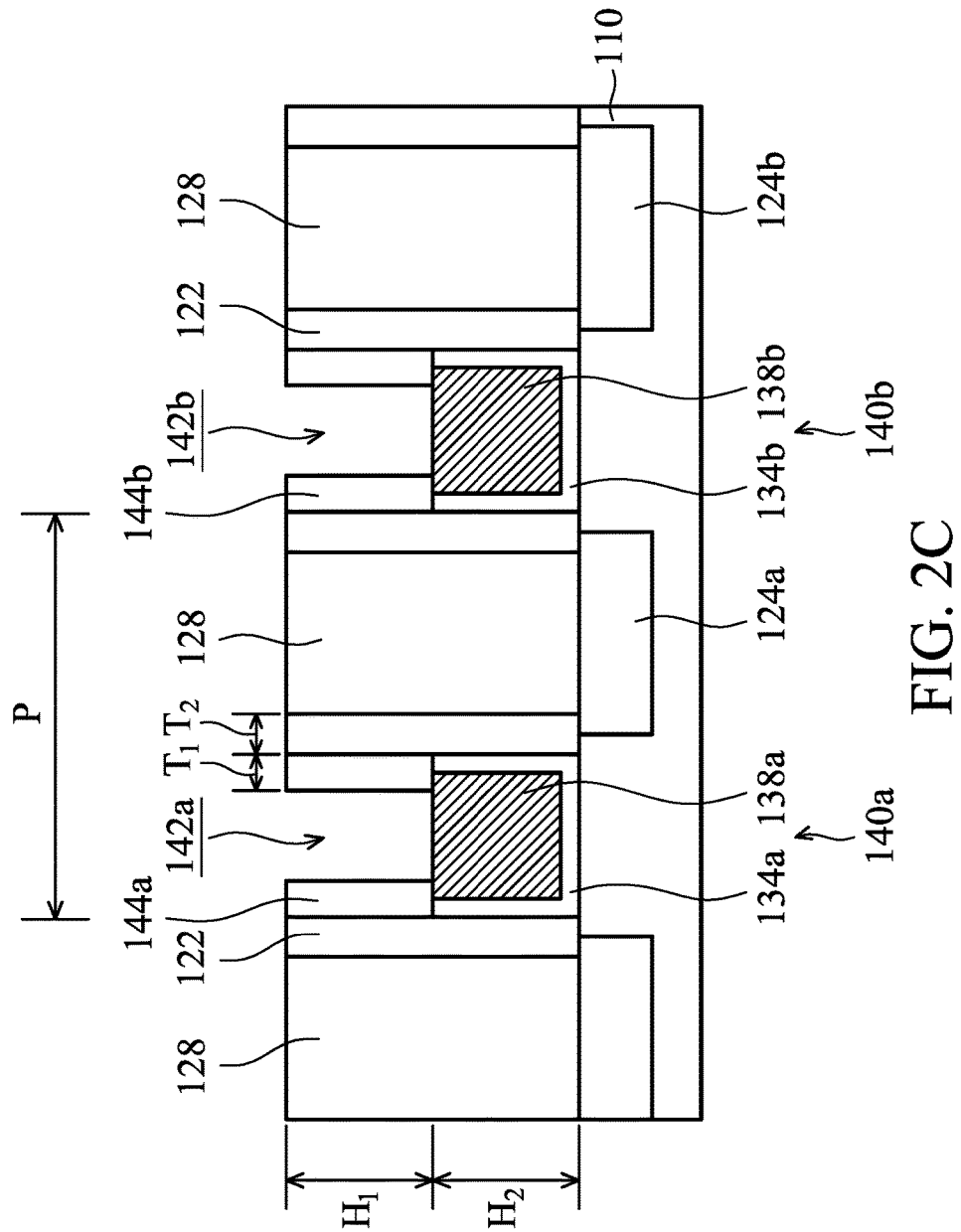

Next, as shown in FIG. 2C, the first spacer layer 144a and the second spacer layer 144b are formed above the first gate structure 140a and the second gate structure 140b, respectively, in accordance with some embodiments. More specifically, a pair of first spacer layers 144a are formed on opposite sidewall surfaces of the first opening 142a, and a pair of second spacer layers 144b are formed on opposite sidewall surfaces of the second opening 142b. Each of the first spacer layers 144a is directly above the first gate dielectric layer 136a, and each of the second spacer layers 144b is directly above the second gate dielectric layer 136b.

The first spacer layer 144a has a first thickness $T_1$ which is measured from an inner sidewall surface to an outer sidewall surface of the first spacer layer 114a in a horizontal direction. Each of the gate spacer layers 122 has a second thickness $T_2$ which is measured from an inner sidewall surface to an outer sidewall surface of the gate spacer layer 122 in a horizontal direction. In some embodiments, a ratio $(T_1/T_2)$ of the first thickness $T_1$ to the second thickness $T_2$ is in a range from about 0.1 to about 1. The first spacer layer 144a has a first height $H_1$ which is measured from a top surface to a bottom surface of the first spacer layer 144a. The first gate structure 140a has a second height $H_2$ which is measured from a top surface to a bottom surface of the first gate structure 140a. In some embodiments, a ratio $(H_1/H_2)$ of the first height $H_1$ to the second height $H_2$ is in a range from about 1 to about ⅔. In some embodiments, the first height $H_1$ is in a range from about 10 nm to about 20 nm. In some embodiments, the second height $H_2$ is in a range from about 10 nm to about 30 nm.

A pitch P is between a left sidewall surface of the first gate structure 140a to a left sidewall surface of second gate structure 140b. In some embodiments, the pitch P is in a range from about 40 nm to about 60 nm.

Figure 2D:
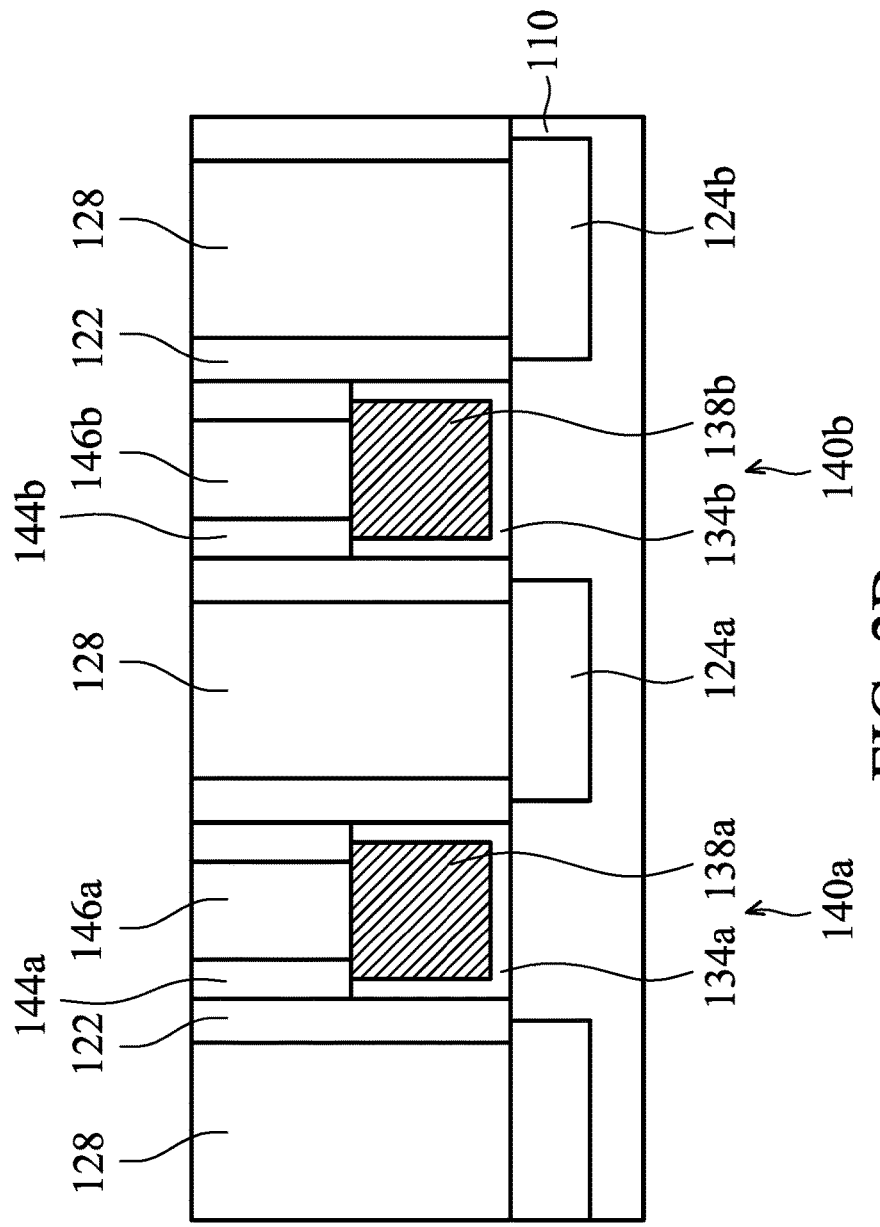

Afterwards, as shown in FIG. 2D, the first insulation layer 146a is formed in the first opening 142a, and the second insulation layer 146b is formed in the second opening 142b, in accordance with some embodiments. The etching selectivity of the first spacer layer 144a with respect to the first insulation layer 146a is high. Therefore, the first spacer layer 144a is not removed when the first insulation layer 146a is removed. In addition, the etching selectivity of the second spacer layer 144b with respect to the second insulation layer 146b is high. Therefore, the second spacer layer 144b is not removed when the second insulation layer 146b is removed.

More specifically, as shown in FIG. 2E, the first S/D contact structure 150a is formed on the first S/D structure 124a, and the second S/D contact structure 150b is formed on the second S/D structure 124b, in accordance with some embodiments. The first S/D contact structure 150a is electrically connected to the first S/D structure 124a, and the second S/D contact structure 150b is electrically connected to the second S/D structure 124b.

Figure 2F:
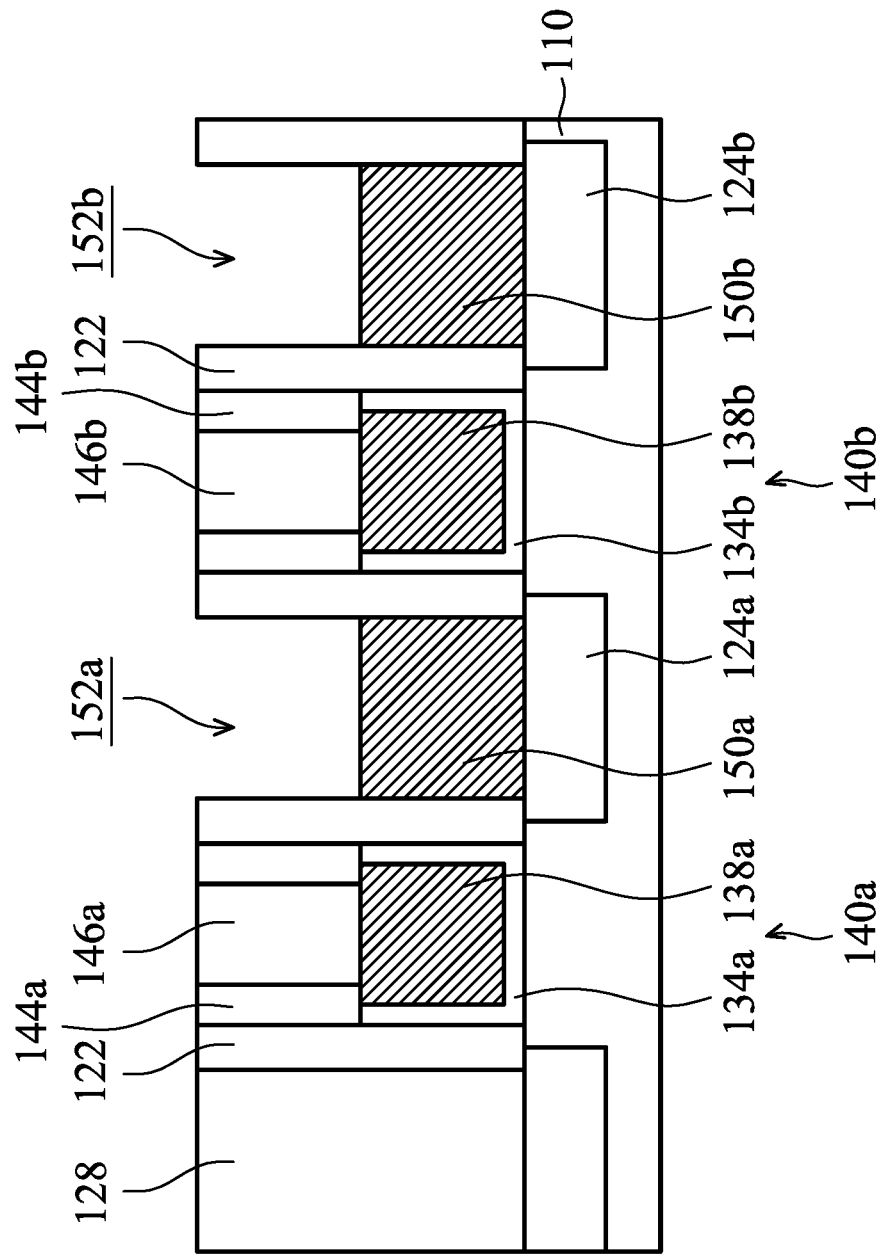

Afterwards, as shown in FIG. 2F, a top portion of the first S/D contact structure 150a and a top portion of the second S/D contact structure are removed to form a third opening 152a and a fourth opening 152b, respectively, in accordance with some embodiments. As a result, the top surface of the remaining first S/D contact structure 150a is level with the top surface of the remaining first gate electrode layer 138a. In addition, the top surface of the remaining second S/D contact structure 150b is level with the top surface of the remaining second gate electrode layer 138b.

Figure 2G:
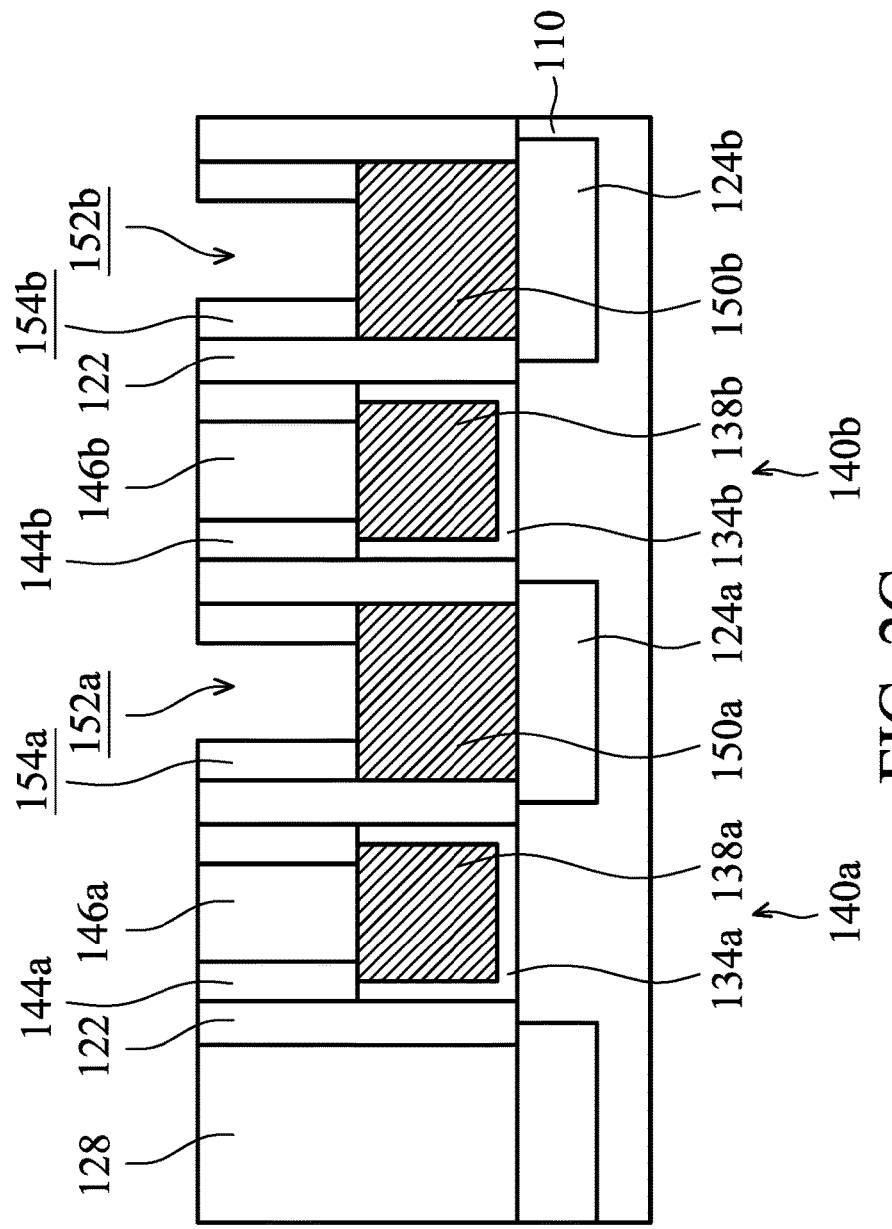

As shown in FIG. 2G, the third spacer layer 154a is formed over the first S/D contact structure 150a, and the fourth spacer layer 154b is formed over the second S/D contact structure 150b, in accordance with some embodiments.

Figure 2H:
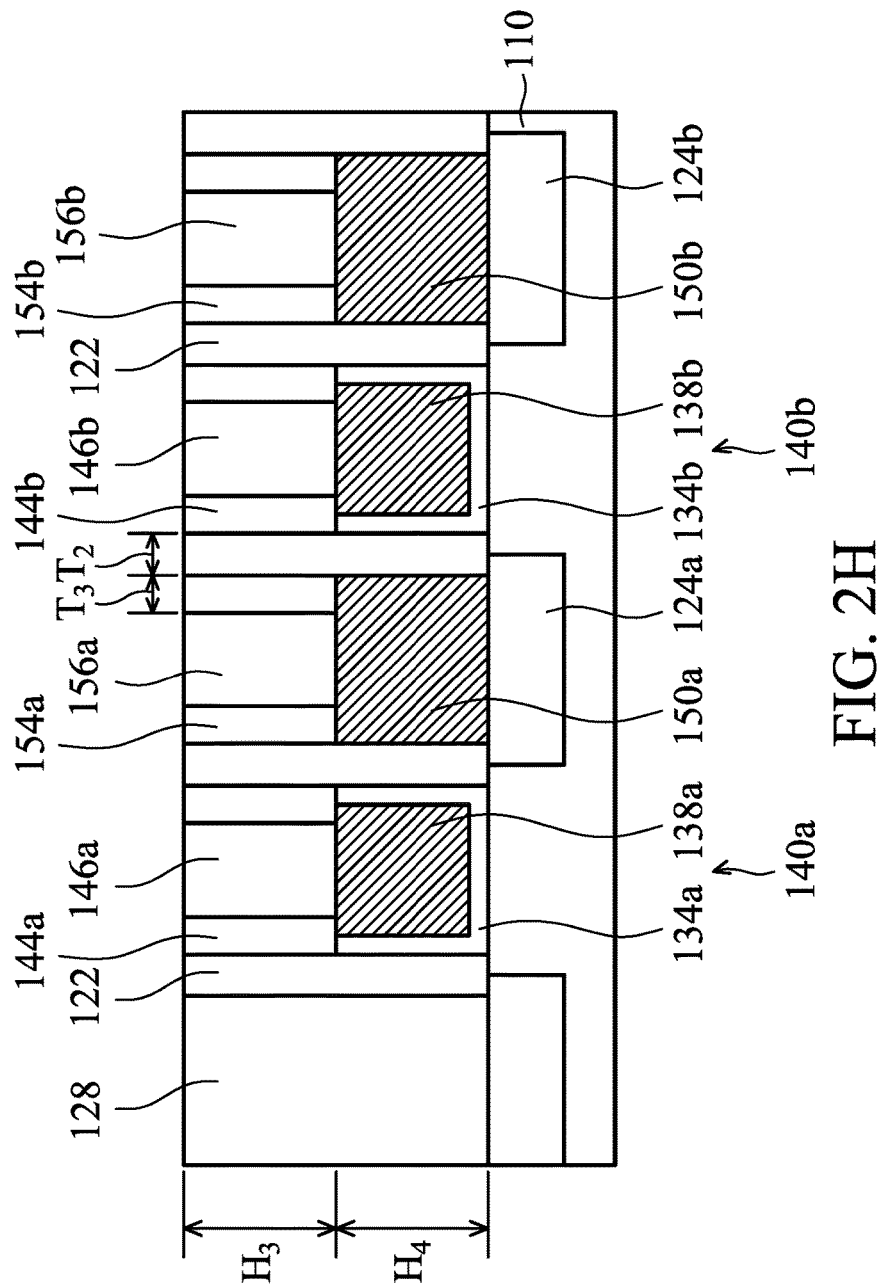

Next, as shown in FIG. 2H, the third insulation layer 156a is formed over the first S/D contact structure 150a, and the fourth insulation layer 156b is formed over the second S/D contact structure 150b, in accordance with some embodiments. The third insulation layer 156a is between two third spacer layers 154a, and the fourth insulation layer 156b is between two fourth spacer layers 154b. Since the etching selectivity of the third spacer layer 154a with respect to the third insulation layer 156a is high, the third spacer layer 154a is not removed when the first insulation layer 146a is removed.

The third spacer layer 154a has a third thickness $T_3$ which is measured from an inner sidewall surface to an outer sidewall surface of the third spacer layer 154a in a horizontal direction. Each of the gate spacer layers 122 has a second thickness $T_2$ which is measured from an inner sidewall surface to an outer sidewall surface of the gate spacer layer 122 in a horizontal direction. In some embodiments, a ratio $(T_3/T_2)$ of the third thickness $T_3$ to the second thickness $T_2$ is in a range from about 0.1 to about 1. The third spacer layer 154a has a third height $H_3$ which is measured from a top surface to a bottom surface of the third spacer layer 154a. The first S/D contact structure 150a has a fourth height $H_4$ which is measured from a top surface to a bottom surface of the first S/D contact structure 150a. In some embodiments, a ratio $(H_3/H_4)$ of the third height $H_3$ to the fourth height $H_4$ is in a range from about 1 to about ⅔. In some embodiments, the third height $H_3$ is in a range from about 10 nm to about 20 nm. In some embodiments, the fourth height $H_4$ is in a range from about 10 nm to about 30 nm.

Figure 2I:
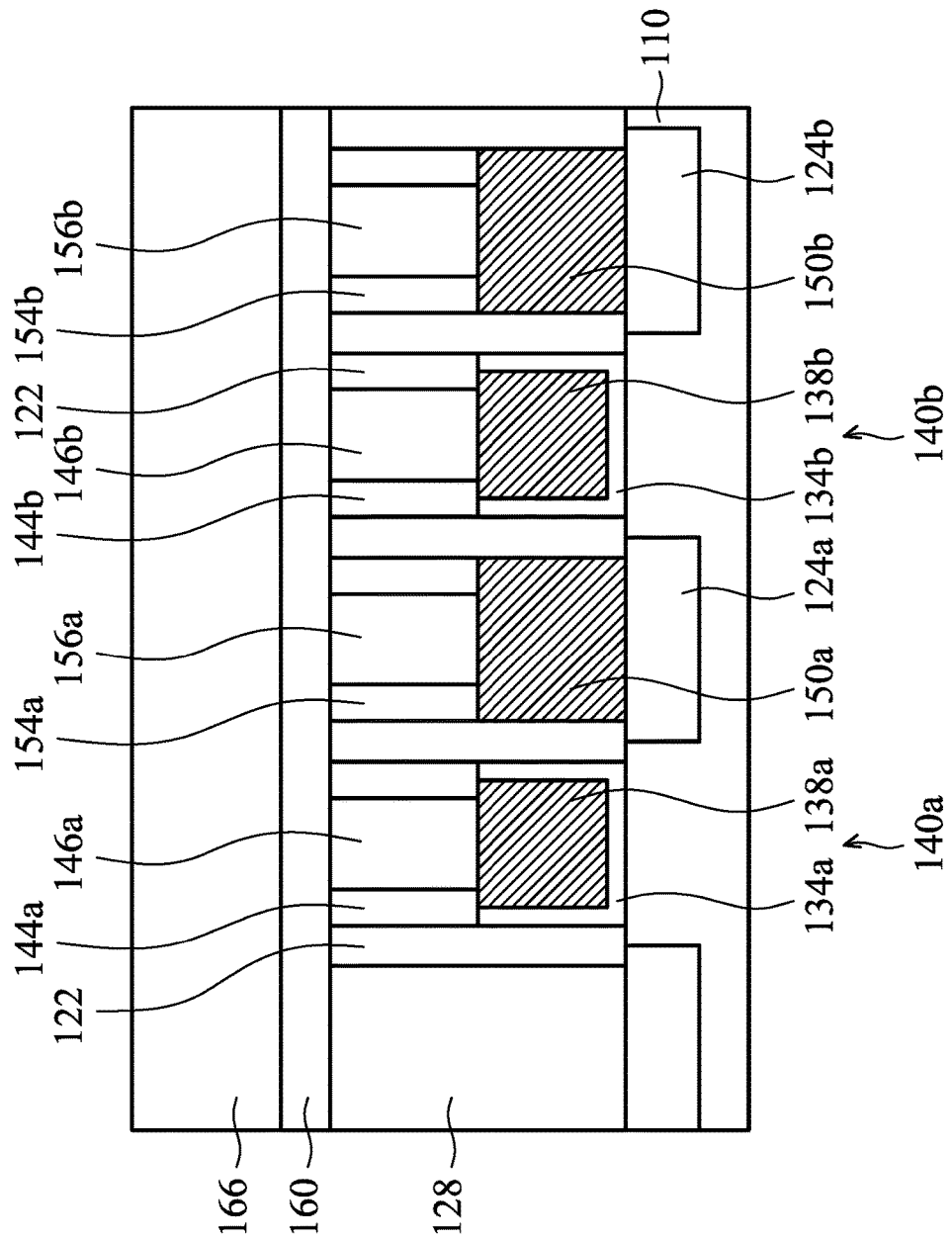

Afterwards, as shown in FIG. 2I, the etch stop layer 160 is formed over the first spacer layer 114a, the second spacer layer 144b, the third spacer layer 154a, the fourth spacer layer 164b, the first insulation layer 146a, the second insulation layer 146b, the third insulation layer 156a and the fourth insulation layer 156b, in accordance with some embodiments. Next, the dielectric layer 166 formed over the etch stop layer 160.

Figure 2J:
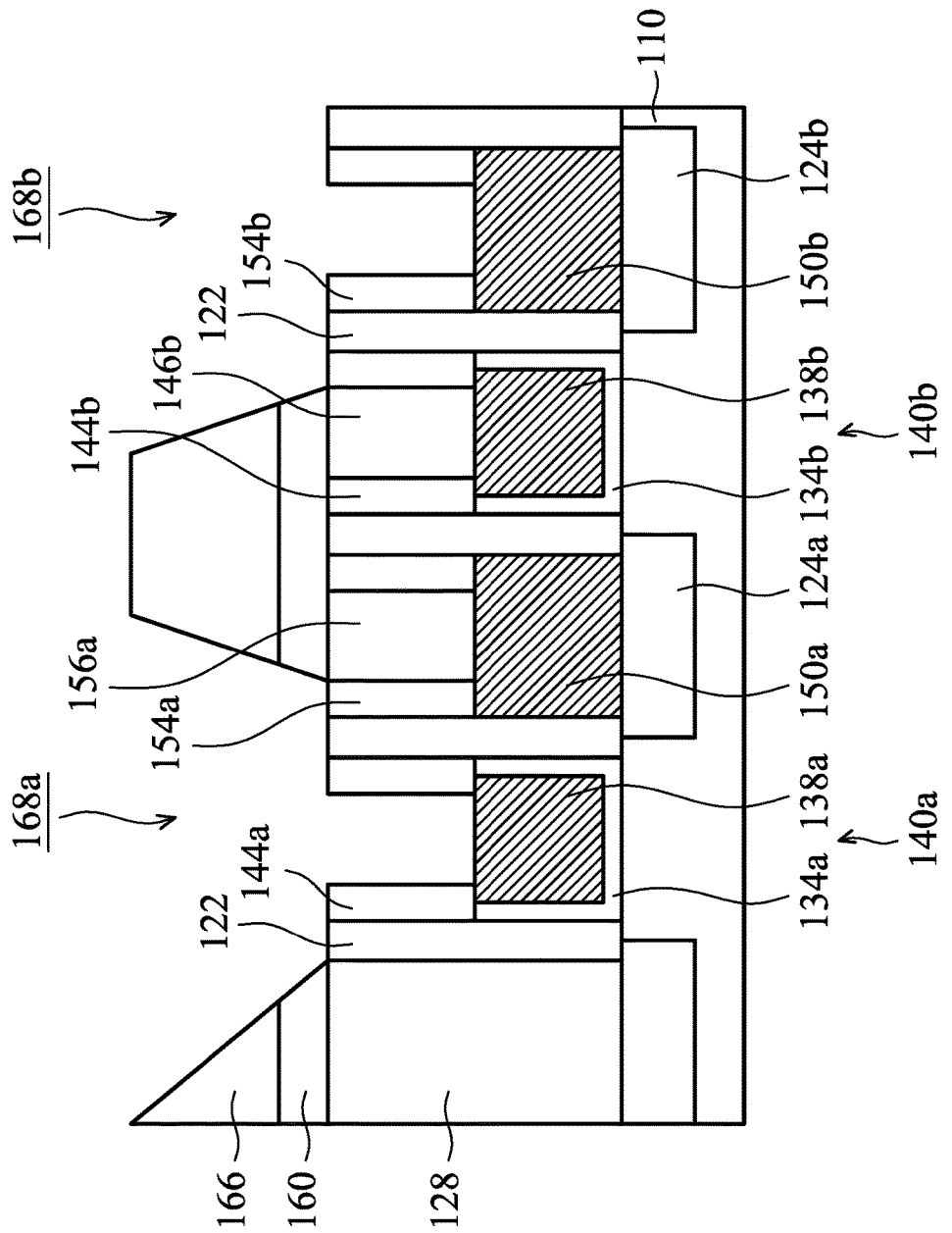

As shown in FIG. 2J, a portion of the dielectric layer 166 and a portion of etch stop layer 160 are removed, and then a portion of the first insulation layer 146a is removed to form a first trench 168a over the first gate structure 140a, in accordance with some embodiments.

Figure 2K:
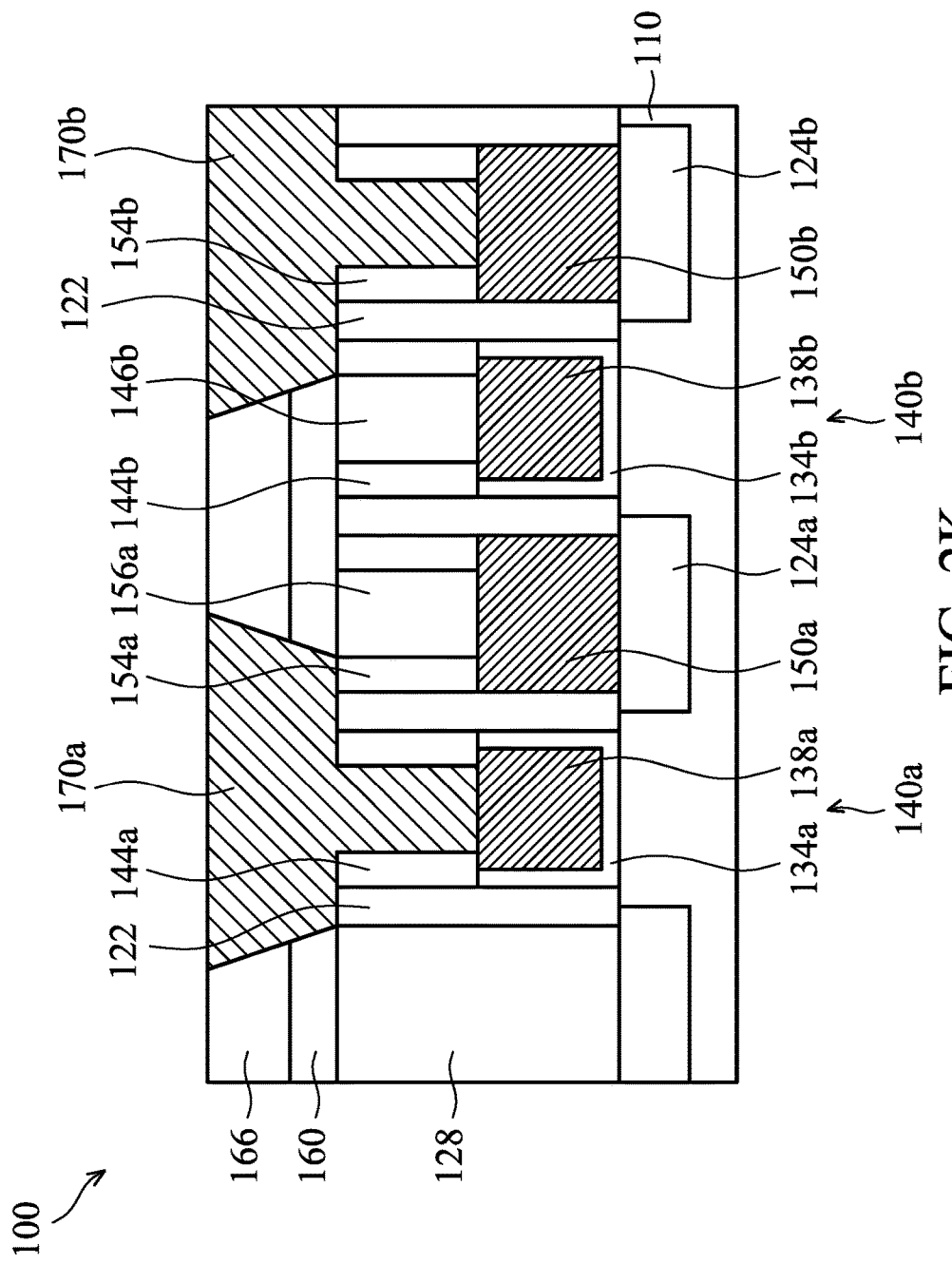

Next, as shown in FIG. 2K, the first conductive plug 170a is formed in the first trench 168a, and the second conductive plug 170b is formed in the second trench 168b, in accordance with some embodiments.

As the dimensions of the FinFET device structure is gradually reduced, the process window is gradually reduced. In order to enlarge the isolation window, the spacers layers 144a, 144b, 154a, 154b are designed to have a higher etching resistance. The third spacer layer 154a protects the third insulation layer 156a and the first S/D contact structure 150a, and therefore the isolation window is enlarged. Similarly, the second spacer layer 144b protects the second insulation layer 144b and the second gate structure 140b, and therefore the isolation window is enlarged.

Embodiments for forming a FinFET device structure and method for formation the same are provided. The FinFET device structure includes a gate structure formed over a fin structure, and a conductive plug is formed over the gate structure to electrically connect to the gate structure. A source/drain (S/D) contact structure is formed over the fin structure and adjacent to the gate structure. A first spacer layer is adjacent to the conductive plug and a second spacer layer is adjacent to the first spacer layer. The first spacer layer and the second spacer layer provide protection to reduce the risk of an electrical short forming between the gate structure and the S/D contact structure. Therefore, the isolation window is enlarged and the performance of the FinFET device structure is improved.

In some embodiments, a FinFET device structure is provided. The FinFET device structure includes a fin structure formed over a substrate and a first gate structure formed over the fin structure. The FinFET device structure includes a conductive plug formed over the first gate structure, and the conductive plug is electrically connected to the first gate structure. The FinFET device structure includes a first spacer layer formed on a sidewall surface of the conductive plug and a source/drain (S/D) contact structure formed over the fin structure and adjacent to the first gate structure. The FinFET device structure further includes a first insulation layer formed over the S/D contact structure and a second spacer layer formed on a sidewall surface of the first insulation layer. The conductive plug extends from a first position which is above the first spacer layers to a second position which is above the second spacer layer.

In some embodiments, a FinFET device structure is provided. The FinFET device structure includes a fin structure formed over a substrate and a first gate structure formed over the fin structure. The FinFET device structure includes a first insulation layer formed over the first gate structure and a first spacer layer formed on a sidewall surface of the first insulation layer. The FinFET device structure also includes a first source/drain (S/D) contact structure formed over the fin structure and adjacent to the first gate structure and a first conductive plug formed over the first S/D contact structure. The first conductive plug is electrically connected to the first S/D contact structure. The FinFET device structure further includes a second spacer layer formed on a sidewall surface of the first conductive plug, and the first conductive plug extends from a first position which is above the second spacer layers to a second position which is above the first spacer layer.

In some embodiments, a method for forming a FinFET device structure is provided. The method includes forming a fin structure over a substrate and forming a first gate structure over the fin structure. The method includes forming a first spacer layer on a portion of the first gate structure and forming a source/drain (S/D) contact structure over the fin structure. The method also includes forming a second spacer layer on a portion of the S/D contact structure and forming a conductive plug over the first gate structure. The conductive plug is electrically connected to the first gate structure, and the conductive plug extends from a first position which is above the first spacer layer to a second position which is above the second spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a fin structure formed over a substrate;
   a first gate structure formed over the fin structure;
   a contact structure formed over the first gate structure, wherein the contact structure is electrically connected to the first gate structure;
   a first spacer layer formed on a sidewall surface of the contact structure;
   a source/drain (S/D) contact structure formed over the fin structure and adjacent to the first gate structure;
   a first insulation layer formed over the S/D contact structure, wherein the first insulation layer is separated from the first spacer layer; and
   a second spacer layer formed on a sidewall surface of the first insulation layer, wherein the contact structure extends from a first position which is above the first spacer layers to a second position which is above the second spacer layer.

2. The fin field effect transistor (FinFET) device structure as claimed in claim 1, further comprising:
   a source/drain (S/D) structure formed over the fin structure and adjacent to the first gate structure, wherein the source/drain (S/D) contact structure is electrically connected to the S/D structure.

3. The fin field effect transistor (FinFET) device structure as claimed in claim 1, wherein the contact structure is in direct contact with the second spacer layer and is not in direct contact with the S/D contact structure.

4. The fin field effect transistor (FinFET) device structure as claimed in claim 1, further comprising:
   a gate spacer layer formed between the first spacer layer and the second spacer layer, wherein the contact structure is above the gate spacer layer, and the dielectric constant (k value) of the gate spacer layer is smaller than the dielectric constant (k value) of the first spacer layer.

5. The fin field effect transistor (FinFET) device structure as claimed in claim 1, further comprising:
   a second gate structure formed over the fin structure, wherein the S/D contact structure is between the first gate structure and the second gate structure; and
   a second insulation layer formed over the second gate structure, wherein the first insulation layer and the second insulation layer are made of the same material.

6. The fin field effect transistor (FinFET) device structure as claimed in claim 1, wherein a top surface of the first gate structure is level with a top surface of the S/D contact structure.

7. The fin field effect transistor (FinFET) device structure as claimed in claim 1, further comprising:
   an etch stop layer formed over the first spacer layer and the second spacer layer, wherein the contact structure passes through the etch stop layer.

8. The fin field effect transistor (FinFET) device structure as claimed in claim 7, further comprising:
   a dielectric layer formed over the etch stop layer, wherein a portion of the contact structure is embedded in the dielectric layer.

9. The fin field effect transistor (FinFET) device structure as claimed in claim 7, further comprising:
   an isolation structure formed over the substrate, wherein the first gate structure and the S/D contact structure are formed on the isolation structure.

10. The fin field effect transistor (FinFET) device structure as claimed in claim 7, wherein the first gate structure comprises:
    a gate dielectric layer formed on the fin structures, wherein the first spacer layer is directly above the gate dielectric layer; and
    a gate electrode layer formed on the gate dielectric layer.

11. A fin field effect transistor (FinFET) device structure, comprising:
    a fin structure formed over a substrate;
    a first gate structure formed over the fin structure;
    a first insulation layer formed over a top surface of the first gate structure;
    a first spacer layer formed on a sidewall surface of the first insulation layer and the top surface of the first gate structure;
    a first source/drain (S/D) contact structure formed over the fin structure and adjacent to the first gate structure;
    a first conductive plug formed over the first S/D contact structure, wherein the first conductive plug is electrically connected to the first S/D contact structure; and
    a second spacer layer formed on a sidewall surface of the first conductive plug, wherein the first conductive plug extends from a first position which is above the second spacer layers to a second position which is above the first spacer layer.

12. The fin field effect transistor (FinFET) device structure as claimed in claim 11, wherein the first conductive plug is in direct contact with the first spacer layer and not in direct contact with the first gate structure.

13. The fin field effect transistor (FinFET) device structure as claimed in claim 11, further comprising:
    a gate spacer layer formed between the first spacer layer and the second spacer layer, wherein the first conductive plug is above the gate spacer layer.

14. The fin field effect transistor (FinFET) device structure as claimed in claim 11, further comprising:
    a second source/drain (S/D) contact structure formed over the fin structure and adjacent to the first gate structure, wherein the first gate structure is between the first S/D contact structure and the second contact structure; and
    a third spacer layer formed over the second S/D contact structure, wherein the first spacer layer and the third spacer layer are made of the same material.

15. The fin field effect transistor (FinFET) device structure as claimed in claim 14, further comprising:
- a second gate structure formed over the fin structure and adjacent to the second S/D contact structure, wherein the second S/D contact structure is between the first gate structure and the second gate structure;
- a second conductive plug formed over the second gate structure; and
- a fourth spacer layer formed on a sidewall surface of the second conductive plug.

16. The fin field effect transistor (FinFET) device structure as claimed in claim 11, further comprising:
- an etch stop layer formed over the first spacer layer and the second spacer layer, wherein the first conductive plug passes through the etch stop layer; and
- an inter-layer dielectric (ILD) structure formed over the etch stop layer, wherein a portion of the first conductive plug is embedded in the ILD structure.

17. A method for forming a fin field effect transistor (FinFET) device structure, comprising:
- forming a fin structure over a substrate;
- forming a pair of gate spacer layers over the substrate;
- forming a first gate structure between the gate spacer layers over the fin structure;
- removing a top portion of the first gate structure to form an opening between the gate spacer layers above the first gate structure;
- forming a pair of first spacer layers on a portion of the first gate structure and opposite sidewall surfaces of the opening;
- forming a source/drain (S/D) contact structure over the fin structure;
- forming a pair of second spacer layers on a portion of the S/D contact structure; and
- forming a conductive plug between the first spacer layers over the first gate structure, wherein the conductive plug is electrically connected to the first gate structure, and the conductive plug extends from a first position which is above the first spacer layers to a second position which is above the second spacer layers.

18. The method for forming the fin field effect transistor (FinFET) device structure as claimed in claim 17, further comprising:
- forming an etch stop layer over the first spacer layers and the second spacer layers, and
- forming an inter-layer dielectric (ILD) structure over the etch stop layer, wherein the conductive plug passes through the etch stop layer and the ILD structure.

19. The method for forming the fin field effect transistor (FinFET) device structure as claimed in claim 17, wherein forming the first gate structure over the fin structure comprises:
- forming a first dummy gate structure over the fin structure;
- removing the first dummy gate structure to form a trench in the gate spacer layers; and
- filling the first gate structure in the trench.

20. The method for forming the fin field effect transistor (FinFET) device structure as claimed in claim 17, further comprising:
- forming a second gate structure over the fin structure, wherein the S/D contact structure is between the first gate structure and the second gate structure; and
- forming a third spacer layer on a portion of the second gate structure, wherein the third spacer layer and the second spacer layers are made of the same material.

* * * * *